United States Patent
Tanaka et al.

(10) Patent No.: US 8,828,859 B2
(45) Date of Patent: Sep. 9, 2014

(54) METHOD FOR FORMING SEMICONDUCTOR FILM AND METHOD FOR MANUFACTURING SEMICONDUCTOR DEVICE

(75) Inventors: Tetsuhiro Tanaka, Kanagawa (JP); Ryo Tokumaru, Kanagawa (JP); Takashi Ohtsuki, Kanagawa (JP); Ryota Tajima, Kanagawa (JP); Erika Kato, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 115 days.

(21) Appl. No.: 13/368,379

(22) Filed: Feb. 8, 2012

(65) Prior Publication Data

US 2012/0208360 A1    Aug. 16, 2012

(30) Foreign Application Priority Data

Feb. 11, 2011 (JP) ................................ 2011-027964

(51) Int. Cl.
*H01L 21/3205* (2006.01)
*H01L 29/66* (2006.01)
*H01L 29/04* (2006.01)
*H01L 21/02* (2006.01)
*H01L 29/786* (2006.01)

(52) U.S. Cl.
CPC ..... *H01L 29/66765* (2013.01); *H01L 21/02422* (2013.01); *H01L 21/02532* (2013.01); *H01L 29/78648* (2013.01); *H01L 29/78696* (2013.01); *H01L 21/0262* (2013.01); *H01L 29/04* (2013.01)
USPC ....................................................... 438/585

(58) Field of Classification Search
CPC ...................................................... H01L 21/336
USPC ....................................... 257/72; 438/96, 160
See application file for complete search history.

(56) References Cited

U.S. PATENT DOCUMENTS

| 4,409,134 | A | 10/1983 | Yamazaki |
| 6,338,990 | B1 * | 1/2002 | Yanai et al. ................ 438/160 |
| 7,989,325 | B2 | 8/2011 | Yokoi et al. |
| 2005/0255257 | A1 * | 11/2005 | Choi et al. ................. 427/585 |
| 2009/0002591 | A1 | 1/2009 | Yamazaki et al. |

(Continued)

FOREIGN PATENT DOCUMENTS

| EP | 0 731 493 A2 | 9/1996 |
| JP | 2005-049832 | 2/2005 |
| JP | 2009-044134 | 2/2009 |

*Primary Examiner* — Vongsavanh Sengdara
*Assistant Examiner* — Ismail Muse
(74) *Attorney, Agent, or Firm* — Nixon Peabody LLP; Jeffrey L. Costellia

(57) ABSTRACT

A microcrystalline semiconductor film is formed over a substrate using a plasma CVD apparatus which includes a reaction chamber in such a manner that a deposition gas and hydrogen are supplied to the reaction chamber in which the substrate is set between a first electrode and a second electrode; and plasma is generated in the reaction chamber by supplying high-frequency power to the first electrode. Note that the plasma density in a region overlapping with an end portion of the substrate in a region where the plasma is generated is set to be higher than that in a region which is positioned more on the inside than the region overlapping with the end portion of the substrate, so that the microcrystalline semiconductor film is formed over a region which is positioned more on the inside than the end portion of the substrate.

7 Claims, 12 Drawing Sheets

(56) References Cited

U.S. PATENT DOCUMENTS

2009/0009677 A1* 1/2009 Yamazaki et al. ............ 349/43
2009/0047774 A1* 2/2009 Yamazaki .................... 438/479
2009/0114921 A1* 5/2009 Yamazaki et al. ............ 257/72
2010/0047473 A1* 2/2010 Roca I Cabarrocas et al. ............................ 427/575
2011/0230008 A1* 9/2011 Lakshmanan et al. ......... 438/96

* cited by examiner

P: Exhaust means
G: Gas supply means

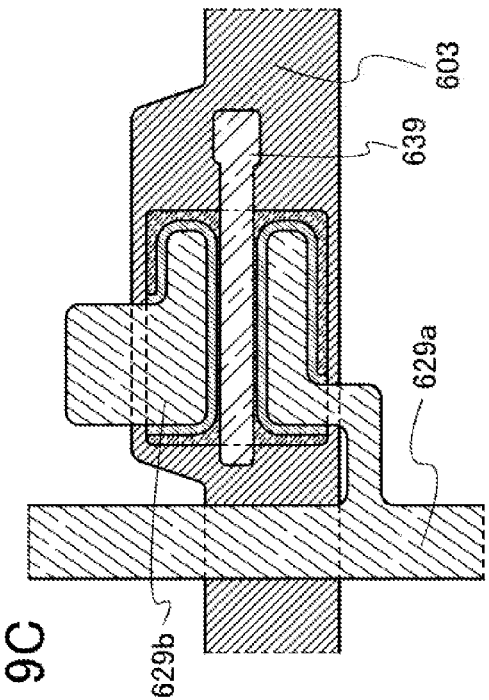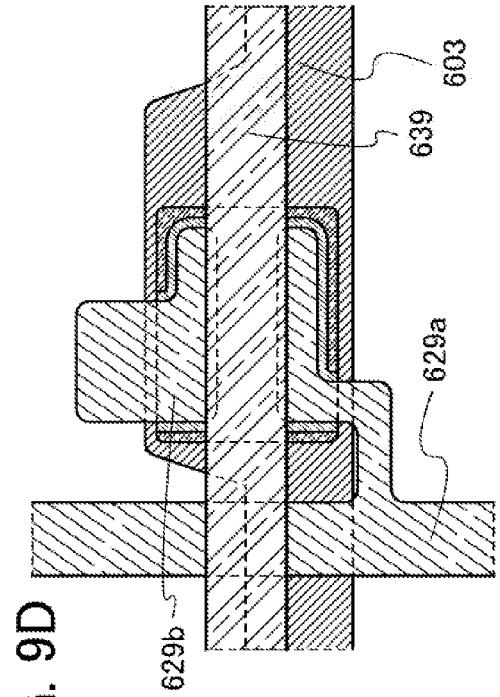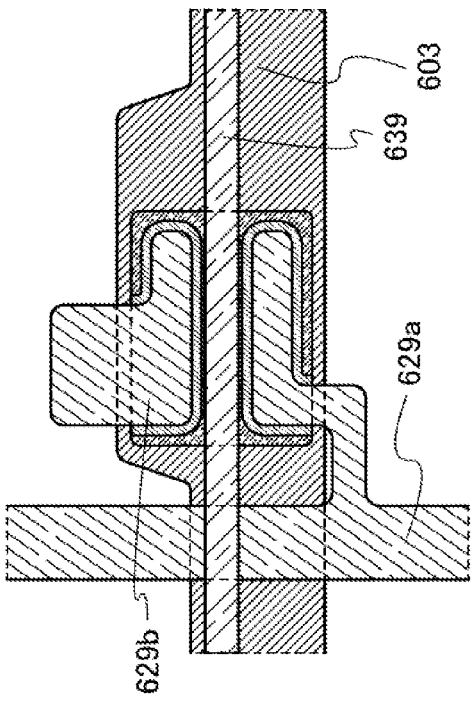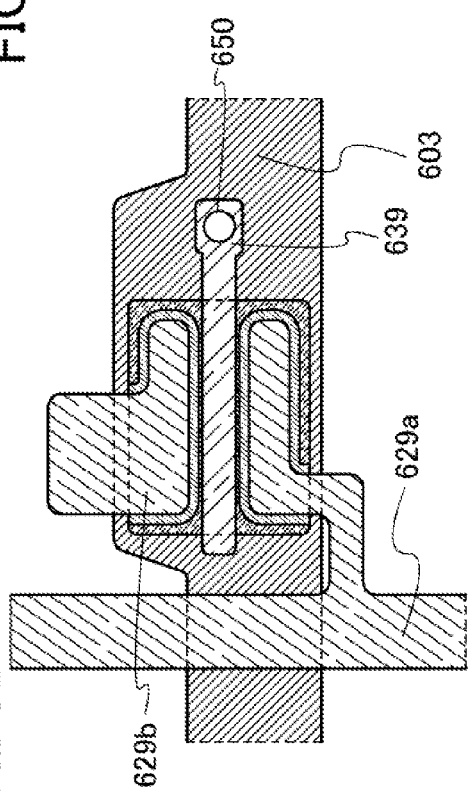

METHOD FOR FORMING SEMICONDUCTOR FILM AND METHOD FOR MANUFACTURING SEMICONDUCTOR DEVICE

BACKGROUND OF THE INVENTION

1. Field of the Invention

The present invention relates to a method for forming a microcrystalline semiconductor film and a method for manufacturing a semiconductor device including the microcrystalline semiconductor film. Further, the present invention relates to a method for forming a semiconductor film and a method for manufacturing a semiconductor device including the semiconductor film.

In this specification, a semiconductor device refers to all the devices that can operate by utilizing semiconductor characteristics. A thin film transistor in this specification is a semiconductor device; and a display device, a semiconductor circuit, and an electronic device including the thin film transistor are all semiconductor devices.

2. Description of the Related Art

As one type of field-effect transistor, a thin film transistor (also referred to as a TFT) whose channel region is formed in a semiconductor film which is formed over a substrate having an insulating surface is known. A technique in which a microcrystalline semiconductor film having a higher field-effect mobility than an amorphous semiconductor film is used as the semiconductor film in the thin film transistor has been disclosed (see Patent Document 1). A technique in which the semiconductor film is formed using silane ($SiH_4$) which is diluted with hydrogen and a rare gas element, for example, has been disclosed (see Patent Document 2).

Typical examples to which the thin film transistor is applied are flat panel displays such as liquid crystal display devices and light-emitting display devices, in which the thin film transistor is practically used as a switching transistor in each pixel in a display screen.

REFERENCE

[Patent Document 1] Japanese Published Patent Application No. 2005-049832
[Patent Document 2] Japanese Published Patent Application No. 2009-044134

SUMMARY OF THE INVENTION

In manufacturing a thin film transistor including a semiconductor film in which a channel region is formed, peeling of a film (such as a gate insulating film, a semiconductor film, or a conductive film) formed in the manufacturing process of the thin film transistor causes reduction in yield. In particular, the adhesion to a gate insulating film in the case of using a microcrystalline semiconductor film as the semiconductor film is poorer than that in the case of using an amorphous semiconductor film as the semiconductor film; thus, there is a peeling problem of the microcrystalline semiconductor film in the former case.

Such a peeling failure of the microcrystalline semiconductor film is significantly caused at an end portion of a substrate, in relation to coverage, stress, and the like of the microcrystalline semiconductor film at the end portion of the substrate.

In order to prevent peeling failures of the microcrystalline semiconductor film, only the end portion of the substrate over which the microcrystalline semiconductor film is formed can be etched. However, an etching mask is needed for the etching. The etching mask is formed by photolithography with the use of a photomask in many cases.

That is, in manufacturing a thin film transistor including a microcrystalline semiconductor film, a peeling failure of the microcrystalline semiconductor film not only decreases yield in manufacturing thin film transistors but also causes an increase in manufacturing cost for the process and a material of photolithography with the use of an etching photomask and the like.

An object of one embodiment of the present invention is to provide a method for forming a microcrystalline semiconductor film having high crystallinity with high productivity. It is an object of one embodiment of the present invention to provide a method for manufacturing a semiconductor device having favorable electrical characteristics and including the microcrystalline semiconductor film with high productivity. It is an object of one embodiment of the present invention is to provide a method for forming a semiconductor film with high productivity. It is an object of one embodiment of the present invention to provide a method for manufacturing a semiconductor device having favorable electrical characteristics and including the semiconductor film with high productivity.

A method with which the above-described objects can be achieved is a method such that a semiconductor film is formed over a region other than an end portion of a substrate so that the semiconductor film is not formed over the end portion of the substrate, using a plasma CVD apparatus which includes a reaction chamber provided with a first electrode (also referred to as an upper electrode) and a second electrode (also referred to as a lower electrode). Note that in this specification, a method in which a film is formed (deposited) from a source gas supplied to a reaction chamber using plasma generated by application of high-frequency power to the first electrode is referred to as a plasma CVD method.

An embodiment of the present invention is a method for forming a semiconductor film using a plasma CVD apparatus which includes a reaction chamber provided with a first electrode and a second electrode. The method includes the steps of supplying a deposition gas and hydrogen to the reaction chamber in which a substrate is set between the first electrode and the second electrode; after the supplying step, adjusting the pressure in the reaction chamber; generating plasma in the reaction chamber by supplying high-frequency power to the first electrode, in which the plasma density in a region overlapping with an end portion of the substrate in a region where the plasma is generated in the reaction chamber is set to be higher than that in a region which is positioned more on the inside than the region overlapping with the end portion of the substrate; and forming a semiconductor film over a region which is positioned more on the inside than the end portion of the substrate. Note that a microcrystalline semiconductor film is formed as the semiconductor film.

The process for forming the semiconductor film using a plasma CVD method includes a process in which a semiconductor film is deposited using reaction species generated from the deposition gas and a process in which part of the semiconductor film is removed by hydrogen radicals generated from the deposition gas and hydrogen. In order not to form the semiconductor film over the end portion of the substrate, the semiconductor film deposited over the end portion of the substrate may be removed by hydrogen radicals. Accordingly, a large number of hydrogen radicals is made to exist over the end portion of the substrate in the region where the plasma may be generated.

Accordingly, another embodiment of the present invention is to form a semiconductor film under conditions such that the amount of hydrogen radicals included in plasma and generated from a deposition gas containing silicon and hydrogen and existing in the region overlapping with the end portion of the substrate is larger than that existing in the region positioned more on the inside than the region overlapping with the end portion of the substrate. Note that a microcrystalline semiconductor film is formed as the semiconductor film.

Specifically, the semiconductor film is formed over the region positioned more on the inside than the end portion of the substrate using a plasma CVD apparatus which includes a reaction chamber provided with a first electrode and a second electrode by a plasma CVD method under the following conditions. A deposition gas is diluted so that the flow rate of hydrogen is more than or equal to 50 times and less than or equal to 2000 times that of the deposition gas in the reaction chamber in which the substrate is set between the first electrode and the second electrode, the pressure in the reaction chamber is set to be higher than or equal to 5000 Pa and lower than or equal to 50000 Pa, and high-frequency power supplied to the first electrode is set to be higher than or equal to 100 W and lower than or equal to 1300 W.

A method for controlling the amount of hydrogen radicals may be such that the flow rate of hydrogen supplied to the reaction chamber is set to be constant and the flow rate ratio of the deposition gas supplied to the reaction chamber to hydrogen supplied to the reaction chamber is increased and decreased.

Specifically, in the plasma CVD apparatus which includes the reaction chamber provided with the first electrode and the second electrode, a first period and a second period are alternately performed. The first period is a period in which a semiconductor film is deposited over the substrate under such conditions that a deposition gas is diluted so that the flow rate of hydrogen is more than or equal to 50 times and less than or equal to 2000 times that of the deposition gas in the reaction chamber in which the substrate is set between the first electrode and the second electrode, the pressure in the reaction chamber is set to be higher than or equal to 5000 Pa and lower than or equal to 50000 Pa, and high-frequency power supplied to the first electrode is set to be higher than or equal to 100 W and lower than or equal to 1300 W. The second period is a period which is longer than the first period and in which the semiconductor film deposited over the end portion of the substrate is selectively removed under such conditions that the flow rate ratio of hydrogen to the deposition gas in the reaction chamber in the second period is more than that in the first period, the pressure in the reaction chamber is set to be higher than or equal to 5000 Pa and lower than or equal to 50000 Pa, and high-frequency power supplied to the first electrode is set to be higher than or equal to 100 W and lower than or equal to 1300 W. Note that a microcrystalline semiconductor film is formed as the semiconductor film.

Note that after a semiconductor film is deposited over an entire surface of the substrate, the semiconductor film deposited over the end portion of the substrate may be removed by hydrogen plasma treatment in which the plasma density in the reaction chamber is controlled.

Accordingly, another embodiment of the present invention is a method for forming a semiconductor film containing silicon using a plasma CVD apparatus which includes a reaction chamber provided with a first electrode and a second electrode, which includes the steps of supplying a deposition gas and hydrogen to the reaction chamber in which a substrate is set between the first electrode and the second electrode; after the supplying step, adjusting the pressure in the reaction chamber; generating plasma in the reaction chamber by supplying high-frequency power to the first electrode, so that a semiconductor film containing silicon is deposited; and performing hydrogen plasma treatment on the deposited semiconductor film containing silicon. In the hydrogen plasma treatment, the plasma density in a region overlapping with an end portion of the substrate in the reaction chamber is set to be higher than that in a region positioned more on the inside than the region overlapping with the end portion of the substrate, so that the semiconductor film containing silicon that is deposited over the end portion of the substrate is selectively removed. Note that a microcrystalline semiconductor film is formed as the semiconductor film.

Note that the amount of hydrogen radicals included in hydrogen plasma generated by the hydrogen plasma treatment and existing in the region overlapping with the end portion of the substrate is larger than that existing in the region which is positioned more on the inside than the region overlapping with the end portion of the substrate.

Specifically, using a plasma CVD apparatus which includes a reaction chamber provided with a first electrode and a second electrode, a semiconductor film containing silicon is formed over the substrate by a plasma CVD method under such conditions that a deposition gas is diluted so that the flow rate of hydrogen is more than or equal to 50 times and less than or equal to 2000 times that of the deposition gas in the reaction chamber in which the substrate is set between the first electrode and the second electrode. Then, the semiconductor film containing silicon deposited over the end portion of the substrate is selectively removed by subjecting the semiconductor film containing silicon to the hydrogen plasma treatment under such conditions that the pressure in the reaction chamber is set to be higher than or equal to 5000 Pa and lower than or equal to 50000 Pa and high-frequency power supplied to the first electrode is set to be higher than or equal to 100 W and lower than or equal to 1300 W.

Another embodiment of the present invention is a method for manufacturing a semiconductor device in which a gate electrode and a semiconductor film overlap with each other with a gate insulating film interposed therebetween, in which the semiconductor film is formed using any of the above-described formation methods.

Using an embodiment of the present invention, a microcrystalline semiconductor film having high crystallinity can be formed with high productivity. In addition, a semiconductor device having favorable electrical characteristics can be manufactured with high productivity by including the microcrystalline semiconductor film. Further, a semiconductor film can be formed with high productivity. In addition, a semiconductor device having favorable electrical characteristics can be manufactured with high productivity by including the semiconductor film.

BRIEF DESCRIPTION OF THE DRAWINGS

In the accompanying drawings:

FIGS. 9A to 9D are top views illustrating examples of a method for manufacturing a semiconductor device according to an embodiment of the present invention;

DETAILED DESCRIPTION OF THE INVENTION

Figure 1:
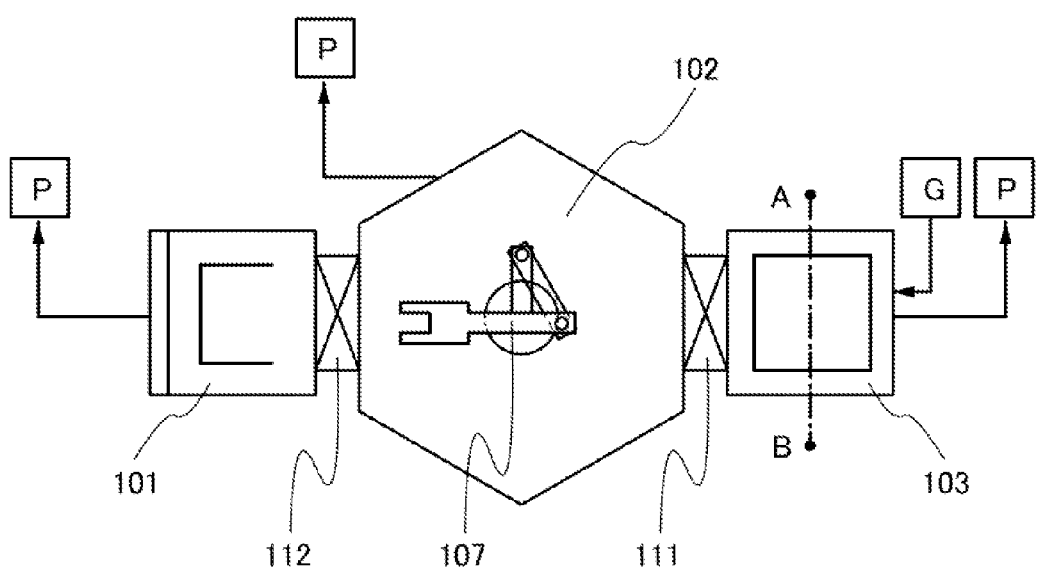
FIG. 1 is a top view illustrating an example of a plasma CVD apparatus used in a formation method according to an embodiment of the present invention.

Embodiments of the present invention will be described in detail with reference to the accompanying drawings. Note that the present invention is not limited to the description below, and it is easily understood by those skilled in the art that a variety of modifications can be made to the modes and details without departing from the spirit and scope of the present invention. Therefore, the present invention should not be construed as being limited to the description in the following embodiments. Note that in the structures of the present invention described below, the same portions or portions having similar functions are denoted by the same reference numerals in common in different drawings and repetitive description thereof will be omitted.

Note that in each drawing described in this specification, the size, the film thickness, or the region of each component may be exaggerated for clarity in some cases. Therefore, embodiments of the present invention are not limited to such scales.

In this specification, the term "film" is used to denote the one which is entirely formed over a surface by a CVD method (including a plasma CVD method and the like), a sputtering method, or the like and the one which is entirely formed over a surface and is then subjected to treatment in a manufacturing process of a semiconductor device.

Note that terms such as "first", "second", and "third" in this specification are used in order to avoid confusion among components, and the terms do not limit the components numerically. Therefore, for example, the term "first" can be replaced with the term "second", "third", or the like as appropriate.

Note that in this specification, "on-state current" is current which flows between a source and a drain when a thin film transistor is in a conducting state. For example, in the case of an n-channel thin film transistor, the on-state current is current which flows between a source and a drain when the gate voltage of the thin film transistor is higher than the threshold voltage thereof. In addition, "off-state current" is current which flows between a source and a drain when a thin film transistor is in a non-conducting state. For example, in the case of an n-channel thin film transistor, the off-state current is current which flows between a source and a drain when the gate voltage of the thin film transistor is lower than the threshold voltage thereof. Note that "gate voltage" refers to a potential difference between a source and a gate when the potential of the source is used as a reference potential.

Functions of a "source" and a "drain" are sometimes replaced with each other when the direction of current flow is changed in circuit operation, for example. Therefore, the terms "source" and "drain" can be used to denote the drain and the source, respectively, in this specification.

Embodiment 1

In this embodiment, a method for forming a microcrystalline semiconductor film according to an embodiment of the present invention will be described. Specifically, a method for forming a microcrystalline semiconductor film described in this embodiment is such that a microcrystalline semiconductor film is formed over a region which is positioned more on the inside than an end portion of a substrate so that the microcrystalline semiconductor film is not formed over the end portion of the substrate, using a plasma CVD apparatus which includes a reaction chamber provided with an upper electrode and a lower electrode.

In an embodiment of the present invention, a deposition gas and hydrogen gas are used as a source gas for forming a microcrystalline semiconductor film. The process for forming the microcrystalline semiconductor film using a plasma CVD apparatus includes a process (i) in which a microcrystalline semiconductor film is deposited using reaction species generated from the deposition gas and a process (ii) in which part of the deposited microcrystalline semiconductor film is removed by hydrogen radicals. These two processes repeat over and over again, and in such processes, the process (i) proceeds dominantly; in this manner, the microcrystalline semiconductor film is formed.

In the case of providing a region where a microcrystalline semiconductor film is formed and a region where a microcrystalline semiconductor film is not formed over a substrate, the process (i) is made to proceed dominantly in the region where a microcrystalline semiconductor film is formed, and the process (ii) is made to proceed dominantly in the region where a microcrystalline semiconductor film is not formed.

By making a large number of hydrogen radicals exist over the region where a microcrystalline semiconductor film is not formed over the substrate, the process (ii) can proceed dominantly. In order to make a large number of hydrogen radicals exist over the region, plasma with high density is generated over the region. This is because with high plasma density, energy that contributes to generation of hydrogen radicals from hydrogen and the deposition gas can become high.

Thus, according to one feature of an embodiment of the present invention, in a region where plasma is generated (also referred to as a plasma region) in the plasma CVD apparatus which includes the reaction chamber provided with the upper electrode and the lower electrode, the plasma density over the region where a microcrystalline semiconductor film is not formed is set higher than that over the region where a microcrystalline semiconductor film is formed. In other words, one feature of an embodiment of the present invention is such that in the plasma region the plasma density in a region overlapping with the end portion of the substrate is set higher than that in the region overlapping with the region positioned more on the inside than the end portion of the substrate.

The plasma density is not necessarily uniform in the plasma region in the plasma CVD apparatus which includes the reaction chamber provided with the upper electrode and the lower electrode. For example, in the case of forming a microcrystalline semiconductor film over an insulating substrate arranged over the lower electrode that is a conductor by a plasma CVD method, the plasma density in a region where the upper electrode and the lower electrode overlap without the insulating substrate provided therebetween in the plasma region is higher than the plasma density in a region where the upper electrode and the lower electrode overlap with the insulating substrate provided therebetween in the plasma region. This is because the upper electrode and the lower electrode are both conductors and the plasma density is decreased in a region where an insulator exists between the upper electrode and the lower electrode. Thus, the plasma density in the region overlapping with the end portion of the substrate is expected to be higher than that in the region overlapping with the region positioned more on the inside than the end portion of the substrate.

For an efficient increase in the plasma density, the following method is preferably employed. In a plasma CVD method, plasma generated by glow discharge is used. In addition, as a typical plasma having higher density than the plasma generated by glow discharge, plasma generated by arc discharge can be given. In a plasma CVD apparatus, there is a tendency to cause arc discharge by setting a reaction chamber at a low degree of vacuum (by setting the pressure in the reaction chamber to be high) and by setting high-frequency power to be high. Note that in this specification, "setting the pressure in the reaction chamber to be high" means setting the pressure to be high in a range of vacuum that is lower than the atmospheric pressure.

Therefore, it can be said that in order to generate plasma with high density, it is preferable to generate plasma in a reaction chamber with low degree of vacuum (in the reaction chamber with high pressure) by application of high high-frequency power. Note that in an embodiment of the present invention, generation of plasma with high density is not limited to generation of plasma by arc discharge.

<Structure of a Plasma CVD Apparatus>

Here, a plasma CVD apparatus capable of the above-described formation of the microcrystalline semiconductor film will be described with reference to FIG. 1, FIG. 2, and FIG. 3. Note that as a plasma CVD apparatus according to an embodiment of the present invention, a capacitively coupled high-frequency plasma CVD apparatus including parallel plate electrodes will be described below.

FIG. 1 is a top view illustrating an example of a capacitively coupled high-frequency plasma CVD apparatus. In this embodiment, the plasma CVD apparatus includes one reaction chamber but may include a plurality of reaction chambers. In the case where a plurality of reaction chambers is included, all the reaction chambers do not necessarily have the same structure and may each have different structures. By including a plurality of reaction chambers as described above, the plasma CVD apparatus can perform successive treatment to thin films of a thin film transistor under a reduced pressure without exposing the thin films to the air.

The plasma CVD apparatus described in this embodiment includes a load lock chamber 101, a common chamber 102, and a reaction chamber 103. The load lock chamber 101 and the common chamber 102 are separated by a gate valve 112, and the common chamber 102 and the reaction chamber 103 are separated by the gate valve 111. A substrate set in a cassette in the load lock chamber 101 is transferred to the reaction chamber 103 by a transfer mechanism 107 provided in the common chamber 102. Then, the substrate over which a microcrystalline semiconductor film is formed in the reaction chamber 103 is transferred to the cassette in the load lock chamber 101 by the transfer mechanism 107. The plasma CVD apparatus in this embodiment is of a single-wafer processing type. Note that the plasma CVD apparatus in this embodiment may include a plurality of load lock chambers; in such a case, after formation of the microcrystalline semiconductor film, the substrate may be transferred to a load lock chamber that is different from the one in which the substrate is placed before formation of the microcrystalline semiconductor film.

The reaction chamber 103 is provided with a gas supply means (G) and an exhaust means (P). The load lock chamber 101 and the common chamber 102 are each provided with an exhaust means (P). Each exhaust means (P) provided for the load lock chamber 101 and the common chamber 102 has a means of returning the respective chambers to the atmospheric pressure for the purpose of setting and removing the substrate or for the maintenance purpose such as cleaning of the chambers. A cryopump capable of ultra-high vacuum evacuation can be used for the load lock chamber 101 and the common chamber 102. With the use of the cryopump, the load lock chamber 101 and the common chamber 102 can be evacuated to an ultra-high vacuum of a pressure of lower than $10^{-5}$. Pa, which can reduce impurities entering the reaction chamber 103, causing a reduction in the concentration of impurities in the microcrystalline semiconductor film formed in the reaction chamber 103. Further, the pumping speed of the cryopump is higher than those of the turbo molecular pump and the dry pump; therefore, by providing the cryopump for the load lock chamber that is opened and closed frequently, throughput can be increased.

Figure 2:
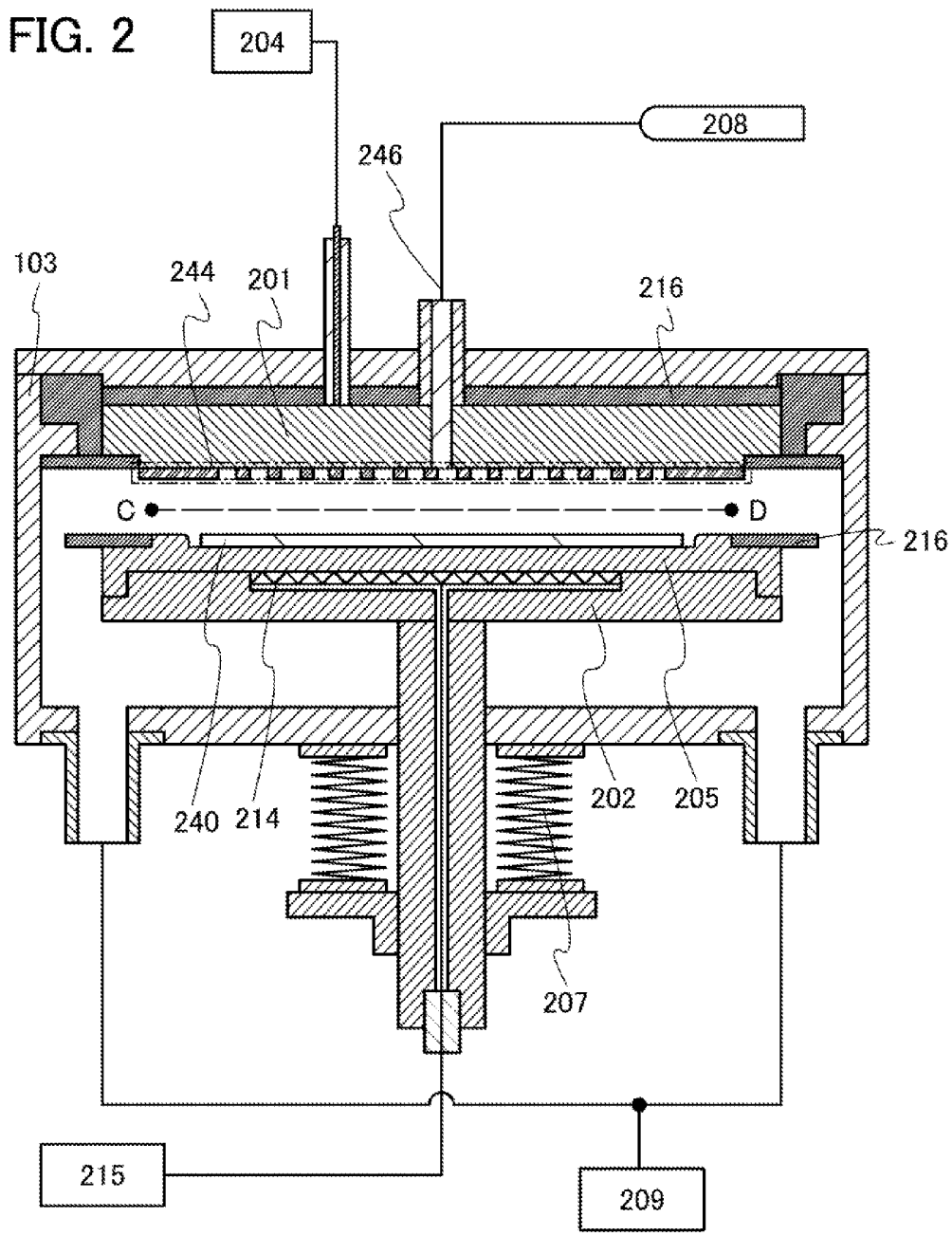
FIG. 2 is a cross-sectional view illustrating an example of a plasma CVD apparatus used in a formation method according to an embodiment of the present invention.
Figure 3:
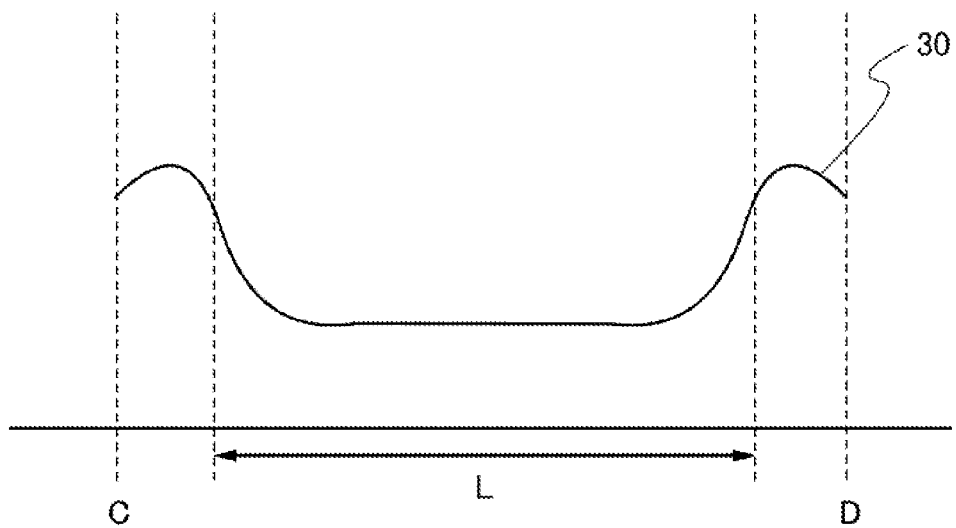
FIG. 3 is a schematic diagram showing plasma density distribution inside a plasma CVD apparatus used in a formation method according to an embodiment of the present invention.

FIG. 2 is a cross-sectional view taken along A-B of the reaction chamber 103 of the plasma CVD apparatus in FIG. 1. The structure of the reaction chamber 103 of the plasma CVD apparatus illustrated in FIG. 2 is only an example and the structure of the reaction chamber 103 is not limited thereto. The reaction chamber 103 is formed of a material having rigidity, such as aluminum or stainless steel, and is structured so that the inside can be vacuum evacuated. Aluminum that has light weight and favorable thermal conductivity is used as a material of the reaction chamber 103 described in this embodiment. The reaction chamber of the plasma CVD apparatus described in this embodiment has a structure capable of being taken apart for the maintenance. Alternatively, the material of the reaction chamber 103 may be stainless steel in order to increase its mechanical strength and the inside of the reaction chamber 103 may be coated with aluminum by thermal spraying. A structure in which the inside of the reaction chamber 103 can be regularly recoated with aluminum by thermal spraying is further preferable.

Further, the reaction chamber 103 is provided with a first electrode (referred to as an upper electrode 201) and a second electrode (referred to as a lower electrode 202) facing the first electrode. The upper electrode 201 and the lower electrode 202 are flat electrodes and are arranged substantially parallel to each other with a certain distance placed therebetween.

As a high-frequency power supply means, a high-frequency power supply 204 is connected to the upper electrode 201. The lower electrode 202 is grounded. A susceptor (supporting base) 205 over which a substrate 240 can be placed is provided in contact with the lower electrode 202. The upper electrode 201 is electrically separated from the reaction chamber 103 by an insulating material 216, so that high-frequency power does not leak out. By also providing the insulating material 216 for the susceptor 205, leakage of high-frequency power can be prevented more surely. For example, in the case where a ceramic material is used as the insulating material 216, it is difficult to use a knife-edge-type metal-seal flange for sealing of the upper electrode and thus, an O-ring seal is preferably used.

By using a metal material as the material of the susceptor 205, the entire region of the susceptor 205 can be set at the same potential as that of the lower electrode 202. It is preferable to use an inner wall of the reaction chamber 103 and the susceptor 205 that have been subjected to glass bead blasting (GBB). By using the inner wall of the reaction chamber 103 and the susceptor 205 that have been subjected to GBB, the amount of particles generated in the reaction chamber 103 can be reduced; specifically, a film deposited in the reaction chamber 103 can be prevented from peeling. This can suppress mixture of the particles into microcrystalline semiconductor films at the time of forming microcrystalline semiconductor films consecutively over a plurality of substrates. Accordingly, peeling of the microcrystalline semiconductor films owing to the particles can be prevented.

The upper electrode 201 is connected to a gas supply means 208 through a gas line 246, and is provided with a gas diffuser plate (a so-called shower plate) 244 that diffuses a gas to the inside of the reaction chamber 103 so that the film thickness and film characteristics become uniform. The gas diffuser plate 244 is formed of a metal material and is set at the same potential as that of the upper electrode 201. Note that a diffuser plate may be further provided between the upper electrode 201 and the gas diffuser plate 244.

The gas supply means 208 includes a cylinder filled with gases, a pressure adjusting valve, a stop valve, a mass flow controller, and the like. The cylinder filled with gases includes a cylinder filled with a deposition gas (gas), a cylinder filled with hydrogen, a cylinder filled with a dilution gas, a cylinder filled with an additive gas, and the like.

As the deposition gas, a deposition gas containing silicon, such as silane ($SiH_4$), disilane ($Si_2H_6$), silane fluoride ($SiF_4$), dichlorosilane ($SiH_2Cl_2$), trichlorosilane ($SiHCl_3$), silicon chloride ($SiCl_4$), silicon fluoride ($SiF_4$), or the like can be used. As the dilution gas, a dilution as containing a rare gas element such as helium, argon, neon, xenon, krypton, or the like can be used. As the additive gas, there is a gas containing boron (B) that is an impurity imparting p-type conductivity, such as borane ($BH_3$) or diborane ($B_2H_6$) or a gas containing phosphorus (P) or arsenic (As) that is an impurity imparting n-type conductivity, such as phosphine ($PH_3$) or arsine ($AsH_3$).

Note that in accordance with a film that is to be formed, a plurality of cylinders filled with a deposition gas, a dilution gas, or an additive gas for forming the film can be provided. For example, as the cylinder filled with the deposition gas, a cylinder filled with a deposition gas containing germanium can be given. For example, as the deposition gas containing germanium, germane ($GeH_4$), digermane ($Ge_2H_6$), germane fluoride ($GeF_4$), and the like can be given.

In addition, a substrate heater 214 is provided in the lower electrode 202, as a temperature control mechanism for controlling the temperature of the substrate 240 placed over the susceptor 205. The temperature of the substrate heater 214 is controlled by a heater controller 215. In the case of providing the substrate heater 214 in the lower electrode 202, it is preferable to employ a thermal conduction heating method. For example, the substrate heater 214 can include a sheathed heater. Note that a substrate holder for holding the substrate 240 may be provided over the susceptor 205.

The high-frequency power supply 204 that is a high-frequency power supply means supplies high-frequency power to the upper electrode 201. The high-frequency power supply means may be provided with a matching box and a high-frequency cut filter as well as the high-frequency power supply 204. Furthermore, a parallel resonance circuit using a coil and a variable capacitor may be provided.

The high-frequency power supply 204 supplies a high-frequency power with a frequency of 100 MHz or less. In the case where a large substrate of the seventh (1870 mm×2200 mm) or later generation is used as a substrate placed over the lower electrode 202, the high-frequency power supply preferably supplies a high-frequency power with a wavelength of approximately 10 m or more. Typically, a frequency of 13.56 MHz or 27.12 MHz in the HF band, or a frequency of 60 MHz in the VHF band is preferable. By superimposing the high-frequency power in the HF band and a high-frequency power in the VHF band on each other, even in the case of using such a large substrate as the substrate placed over the lower electrode 202, unevenness of plasma generated by supply of high-frequency power to the upper electrode 201 can be reduced; the film thickness and film characteristics of the formed microcrystalline semiconductor film can become highly uniform; and the deposition rate of the microcrystalline semiconductor film can be increased.

An exhaust means 209 connected to the reaction chamber 103 has a function of vacuum evacuation and a function of adjusting the pressure to a predetermined pressure and keeping the pressure constant in the reaction chamber 103 at the time of flowing a reaction gas. The exhaust means 209 includes a butterfly valve, a stop valve, a turbo molecular pump, a dry pump, and the like. Note that a plurality of evacuation tubes may be provided in the exhaust means 209.

The distance between the upper electrode 201 and the lower electrode 202 (also referred to as a gap distance) can be changed as appropriate. The adjustment of the gap distance can be conducted by adjusting the height of the lower electrode 202 in the reaction chamber 103. By using a bellows 207, the gap distance can be adjusted with the reaction chamber 103 kept in a vacuum. The gap distance is set to a distance that enables generation of plasma and, for example, may be more than or equal to 1 mm and less than or equal to 15 mm.

<Method for Forming a Microcrystalline Semiconductor Film>

Next, a method for forming a microcrystalline semiconductor film using the above-described plasma CVD apparatus will be described.

First, the substrate 240 set in the cassette of the load lock chamber 101 is transferred to the reaction chamber 103 by the transfer mechanism 107 provided in the common chamber 102 and set over the susceptor 205.

As the substrate 240, in addition to a glass substrate and a ceramic substrate, a plastic substrate or the like having heat resistance to withstand a process temperature in this manufacturing process can be used. In the case where the substrate does not need a light-transmitting property, a metal substrate, such as a stainless steel alloy substrate, provided with an insulating film on its surface may be used. As a glass substrate, for example, an alkali-free glass substrate of barium borosilicate glass, aluminoborosilicate glass, aluminosilicate glass, or the like may be used. Alternatively, a quartz substrate, a sapphire substrate, or the like can be used. Further, as the substrate, a glass substrate with any of the following sizes can be used: the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2950 mm×3400 mm).

Next, the deposition gas and hydrogen are supplied from the gas supply means 208 to the reaction chamber 103, and the pressure in the reaction chamber 103 to which the deposition gas and hydrogen are supplied is adjusted and kept constant. Note that the deposition gas can be selected as appropriate from the kinds of deposition gasses described above. In this embodiment, silane ($SiH_4$) that is a deposition gas containing silicon is used as the deposition gas.

For forming a microcrystalline semiconductor film, the mixing ratio of the deposition gas and hydrogen is set so that the flow rate of hydrogen is more than or equal to 50 times and less than or equal to 2000 times that of the deposition gas, preferably more than or equal to 1000 times and less than or equal to 2000 times that of the deposition gas.

Further, the pressure in the reaction chamber is set to be higher than or equal to 5000 Pa and lower than or equal to 50000 Pa, preferably higher than or equal to 10000 Pa and lower than or equal to 50000 Pa.

Next, high-frequency power is supplied to the upper electrode 201 from the high-frequency power supply 204 connected to the upper electrode 201, so that plasma is generated between the upper electrode 201 and the lower electrode 202; accordingly, a microcrystalline semiconductor film is formed over the substrate. At this time, heating is performed with the substrate heath 214 so that the temperature of the substrate 240 becomes a predetermined temperature, and the temperature of the substrate 240 is kept at the predetermined temperature. The temperature of the substrate 240 is set to be room temperature to 350° C., preferably 150° C. to 280° C. Note that the gap distance is set to a distance that enables generation of plasma.

The region where plasma is generated (plasma region) includes at least a region where the upper electrode 201 and the lower electrode 202 overlap with each other. However, to be exact, because the susceptor 205 having the same potential as the lower electrode 202 is provided on the lower electrode 202, the plasma region is a region where the upper electrode 201 and the susceptor 205 overlap with each other. Thus, the plasma region is at least a region whose range is indicated by dotted line C-D in FIG. 2.

Here, the frequency of power supplied from the high-frequency power supply 204 is set to be 13.56 MHz as described above, and the high-frequency power of the power supply is set to be preferably higher than or equal to 100 W and lower than or equal to 1300 W, further preferably higher than or equal to 700 W and lower than or equal to 1300 W.

Here, the plasma density distribution in the plasma region in the above-described conditions will be described with reference to FIG. 3. FIG. 3 is a schematic diagram of the plasma density distribution in the plasma region. A solid line 30 indicates the plasma density in the reaction chamber 103. A section C-D in the horizontal axis in FIG. 3 corresponds to dotted line C-D in FIG. 2. A distance L in FIG. 3 corresponds to a distance between edges of the substrate 240. In the plasma region, plasma is generated in a region (1) where the upper electrode and the lower electrode overlap with the substrate 240 that is an insulator provided therebetween and a region (2) where the upper electrode and the lower electrode overlap without the substrate 240 that is an insulator provided therebetween. In particular, the region (2) is a region including a space between the insulating material 216 in contact with the susceptor 205 and the edge of the substrate 240, where the upper electrode 201 (including the gas diffuser plate 244) that is a conductor overlaps with only the susceptor 205 that is a conductor. Accordingly, in the plasma region, the plasma density is expected to increase toward the region (2) and reach a maximum in the region (2) because the plasma density is lower in the region where the insulator (the substrate 240 and the insulating material 216) exists between the upper electrode and the lower electrode. The higher the high-frequency power supplied to the upper electrode 201 is, the more significant the difference in the plasma density between the region (1) and the region (2) becomes.

Hydrogen radicals are generated from the deposition gas (here, silane) and hydrogen supplied to the reaction chamber 103 for forming a microcrystalline semiconductor film. The process for forming a microcrystalline semiconductor film using a plasma CVD method includes a process in which a microcrystalline semiconductor film is deposited using reaction species generated from the deposition gas (here, silane) and a process in which the deposited microcrystalline semiconductor film is removed by hydrogen radicals. That is, in the region where more hydrogen radicals exist than the reaction species generated from the deposition gas (here, silane), the process in which the microcrystalline semiconductor film is removed by hydrogen radicals proceeds dominantly. Further, it can be said that a larger number of hydrogen radicals is generated in a region with higher plasma density. In the case where the deposition gas and hydrogen exist uniformly in the reaction chamber 103, it can be said that the distribution of the generated hydrogen radicals in the plasma region substantially corresponds to the above-described plasma density distribution in the plasma region. The amount of generated hydrogen radicals is increased toward the edge of the substrate 240, and that is, a distribution of the hydrogen radicals is similar to the plasma density distribution in FIG. 3. Thus, in a region overlapping with an end portion of the substrate 240 in the plasma region, more hydrogen radicals are generated, so that the process in which the microcrystalline semiconductor film is removed by the hydrogen radicals proceeds dominantly; as a result, a microcrystalline semiconductor film is not formed. Since the difference in the amount of generated hydrogen radicals substantially corresponds to the above-described plasma density distribution in the plasma region, the difference becomes more significant when higher high-frequency power is supplied to the upper electrode 201. Thus, a microcrystalline semiconductor film is formed over the substrate in the region positioned more on the inside than the end portion of the substrate 240.

Because the amount of hydrogen radicals generated mainly by plasma in the region (2) is large, the process of removing the microcrystalline semiconductor film by hydrogen radicals proceeds dominantly over the end portion of the substrate 240. In addition, because the amount of reaction species generated from the deposition gas (here, silane) mainly by plasma in the region (1) is large, the process of depositing a microcrystalline semiconductor film proceeds dominantly over the region positioned more on the inside than the end portion of the substrate 240. Note that since the deposition gas containing silicon such as silane is used as the deposition gas, the microcrystalline semiconductor film here is a microcrystalline semiconductor film containing silicon. If a deposition gas containing germanium is used as the deposition gas, the formed microcrystalline semiconductor film is a microcrystalline semiconductor film containing germanium.

Next, supply of the high-frequency power, the deposition gas, and hydrogen is stopped. Then, the substrate 240 over which the microcrystalline semiconductor film is formed is transferred to the load lock chamber 101 from the reaction chamber 103 by the transfer mechanism 107 provided in the common chamber 102, and is taken out from the load lock chamber 101.

Figure 4:
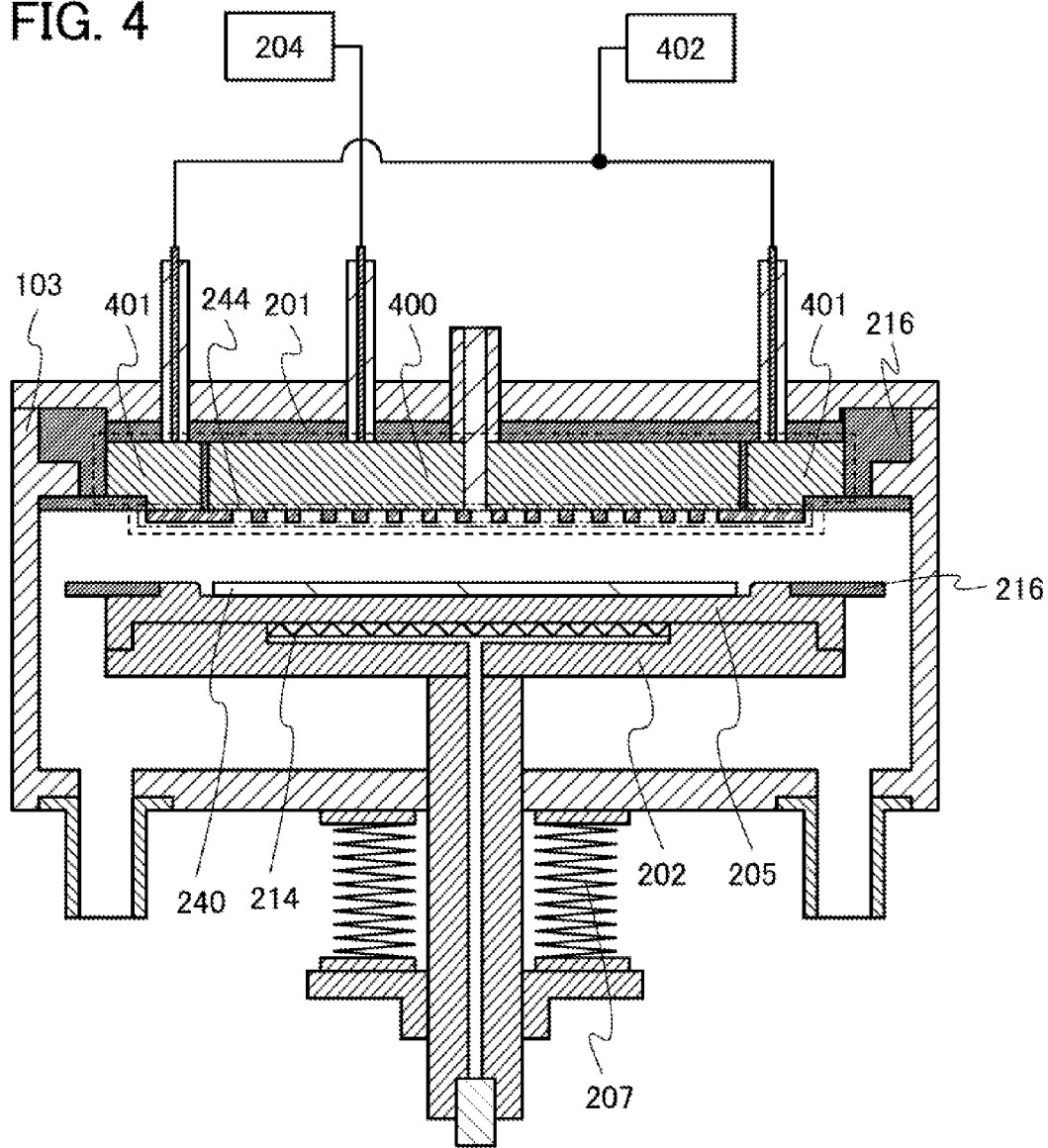
FIG. 4 is a cross-sectional view illustrating an example of a plasma CVD apparatus used in a formation method according to an embodiment of the present invention.

In order not to form the microcrystalline semiconductor film over the end portion of the substrate 240, it is important to set the plasma density over the end portion of the substrate 240 to be high for generating a large number of hydrogen radicals. Therefore, without limitation to the structure as illustrated in FIG. 2 in which one upper electrode 201 is provided, the plasma CVD apparatus may have the following structure as illustrated in FIG. 4: the upper electrode 201 includes a first upper electrode 400 and a second upper electrode 401, the high-frequency power supply 204 is connected to the first upper electrode 400, and a high-frequency power supply 402 is connected to the second upper electrode 401, so that different high-frequency powers can be supplied to the first upper electrode 400 and the second upper electrode 401. Note that the high-frequency power supply 402 is a high-frequency power supply means capable of outputting high-frequency waves having higher wavelength than those output from the high-frequency power supply 204. Further, it is preferable to provide the second upper electrode 401 so as to overlap with a region including a space between the insulating material 216 in contact with the susceptor 205 and the edge of the substrate 240. In this manner, high plasma density over the end portion of the substrate 240 and easy generation of hydrogen radials can be achieved.

In consideration of the influence caused by supplying high-frequency power to the first upper electrode 400 and the second upper electrode 401, it is preferable to provide an insulating material, specifically a band rejection filter, between the first upper electrode 400 and the second upper electrode 401.

In the method for forming a microcrystalline semiconductor film described in this embodiment, at least one of a dilution gas and an additive gas may be added in addition to the deposition gas and the hydrogen gas which are source gases.

The dilution gas preferably contains a gas containing any of the above-described rare gas elements. In the case where the formed microcrystalline semiconductor film contains the rare gas element, lattice distortion can be further promoted and stability is increased, whereby favorable microcrystalline semiconductor can be obtained. Such a microcrystalline semiconductor is disclosed in, for example, U.S. Pat. No. 4,409,134. By adding the dilution gas containing a rare gas element, crystallinity of the microcrystalline semiconductor film can be increased as well.

As the additive gas, any of the above-described gasses containing boron (B) that is an impurity imparting p-type conductivity or the above-described gases containing phosphorus (P) or arsenic (As) that is an impurity imparting n-type conductivity can be used. By containing the impurity, the microcrystalline semiconductor film with improved one conductivity type can be formed.

In the above-described manner, a microcrystalline semiconductor film can be formed over a region positioned more on the inside than an end portion of a substrate so that the microcrystalline semiconductor film is not formed over the end portion of the substrate. Accordingly, when a semiconductor device including the microcrystalline semiconductor film is manufactured, peeling failures of the microcrystalline semiconductor film over the end portion of the substrate can be prevented; therefore, yield of the semiconductor device can be improved. Since the microcrystalline semiconductor film has higher conductivity than an amorphous semiconductor film, when the method for forming a microcrystalline semiconductor film described in this embodiment is employed, a semiconductor device with favorable electrical characteristics can be manufactured with high productivity.

Note that the structure in this embodiment can be combined with any of the structures in the other embodiments as appropriate.

Embodiment 2

In this embodiment, a method for forming a microcrystalline semiconductor film according to an embodiment of the present invention, which is different from the method described in Embodiment 1, will be described.

As described in Embodiment 1, in order not to form a microcrystalline semiconductor film over an end portion of a substrate, a large number of hydrogen radicals is generated in a region overlapping with the end portion of the substrate in a reaction chamber, so that a process in which a microcrystalline semiconductor film deposited by reaction species generated from a; deposition gas is removed by the hydrogen radicals proceeds dominantly.

The method described in this embodiment involves a step of depositing a microcrystalline semiconductor film over an entire surface of a substrate, and a later step of selectively removing the microcrystalline semiconductor film deposited in a region overlapping with an end portion of the substrate in a reaction chamber. The selectively removing step is performed by generating many hydrogen radicals in the region by hydrogen plasma treatment performed on the deposited microcrystalline semiconductor film with a plasma density set to be similar to that in Embodiment 1.

The structure of a plasma CVD apparatus used in this embodiment is similar to that in Embodiment 1, and the process of transferring the substrate 240 to the reaction chamber 103 and setting the substrate 240 over the susceptor 205 is similar to that in Embodiment 1.

Next, a deposition gas and hydrogen are supplied from the gas supply means 208 to the reaction chamber 103, and the pressure in the reaction chamber 103 to which the deposition gas and hydrogen are supplied is adjusted and kept constant. Further, high-frequency power is supplied to the upper electrode 201 from the high-frequency power supply 204 connected to the upper electrode 201, so that plasma is generated between the upper electrode 201 and the lower electrode 202; accordingly, a microcrystalline semiconductor film is formed over the substrate. Note that the deposition gas can be selected as appropriate in a manner similar to that of Embodiment 1. In this embodiment, silane ($SiH_4$) that is a deposition gas containing silicon is used as the deposition gas.

In the step of depositing a microcrystalline semiconductor film, the mixing ratio of the deposition gas and hydrogen is set so that the flow rate of hydrogen is more than or equal to 50 times and less than or equal to 2000 times that of the deposition gas. Note that the pressure in the reaction chamber to which the deposition gas and hydrogen are supplied and the high-frequency power supplied to the upper electrode 201 may be selected as appropriate so as to form the microcrystalline semiconductor film over the entire surface of the substrate 240. At this time, heating is performed with the substrate heater 214 so that the temperature of the substrate 240 becomes a predetermined temperature, and the temperature of the substrate 240 is kept at the predetermined temperature. The temperature of the substrate 240 is set to be room temperature to 350° C., preferably 150° C. to 280° C. Note that the gap distance is set to a distance that enables generation of plasma.

Following the deposition of the microcrystalline semiconductor film over the entire surface of the substrate 240, hydrogen plasma treatment is performed on the deposited microcrystalline semiconductor film.

In the hydrogen plasma treatment, first, supply of the deposition gas is stopped, and only hydrogen is supplied to the reaction chamber 103 from the gas supply means 208. The pressure in the reaction chamber 103 to which hydrogen has been supplied is adjusted and kept constant. At this time, based on the description in Embodiment 1, it is preferable that the pressure in the reaction chamber 103 be set to be higher than or equal to 5000 Pa and lower than or equal to 50000 Pa, preferably higher than or equal to 10000 Pa and lower than or equal to 50000 Pa.

Next, high-frequency power is supplied to the upper electrode 201 from the high-frequency power supply 204 connected to the upper electrode 201, so that plasma is generated between the upper electrode 201 and the lower electrode 202; thus, the deposited microcrystalline semiconductor film is subjected to hydrogen plasma treatment.

The region where plasma is generated (plasma region) is at least a region where the upper electrode 201 and the lower electrode 202 overlap with each other. However, to be exact, because the susceptor 205 having the same potential as the lower electrode 202 is provided on the lower electrode 202, the plasma region is a region where the upper electrode 201 and the susceptor 205 overlap with each other. Thus, the plasma region is at least a region whose range is indicated by dotted line C-D in FIG. 2.

Based on the description in Embodiment 1, the frequency of power supplied from the high-frequency power supply 204 can be selected as appropriate. Here, the frequency is set to be 13.56 MHz, and the high-frequency power is set to be preferably higher than or equal to 100 W and lower than or equal to 1300 W, further preferably higher than or equal to 700 W and lower than or equal to 1300 W.

By the hydrogen plasma treatment under the above conditions, the distribution of the plasma density and the distribution of hydrogen radicals can become similar to those in Embodiment 1. Accordingly, only the microcrystalline semiconductor film deposited over the end portion of the substrate 240 can be selectively removed.

In formation of the microcrystalline semiconductor film, the range of applicable conditions of the pressure in the reaction chamber 103 and the high-frequency power supplied to the upper electrode 201 in the method described in this embodiment is wide as compared to that in the method described in Embodiment 1. Therefore, a semiconductor device can be manufactured using a microcrystalline semiconductor film formed under various conditions of the pressure and the high-frequency power.

Further, the region in which the microcrystalline semiconductor film is not formed over the end portion of the substrate 240 can be controlled more precisely (more accurately) in the method described in this embodiment than the method described in Embodiment 1.

Next, supply of the high-frequency power and hydrogen is stopped. Then, the substrate 240 is transferred to the load lock chamber 101 from the reaction chamber 103 by the transfer mechanism 107 provided in the common chamber 102, and is removed from the load lock chamber 101.

In a manner similar to that of the plasma CVD apparatus in Embodiment 1, the plasma CVD apparatus in this embodiment may have a structure in which the upper electrode 201 includes the first upper electrode 400 and the second upper electrode 401 to which the high-frequency power supply 204 and the high-frequency power supply 402 are connected respectively (see FIG. 4).

In a manner similar to that of Embodiment 1, at least one of a dilution gas and an additive gas may be added in addition to the deposition gas and the hydrogen gas which are source gases, in the method for forming a microcrystalline semiconductor film described in this embodiment.

In the above-described manner, the microcrystalline semiconductor film over the end portion of the substrate can be selectively removed. Accordingly, when a semiconductor device including the microcrystalline semiconductor film is manufactured, peeling failures of the microcrystalline semiconductor film over the end portion of the substrate can be prevented; therefore, yield of the semiconductor device can be improved. Since the microcrystalline semiconductor film has higher conductivity than an amorphous semiconductor film, when the method for forming a microcrystalline semiconductor film described in this embodiment is employed, a semiconductor device with favorable electrical characteristics can be manufactured with high productivity.

Note that the structure in this embodiment can be combined with any of the structures in the other embodiments as appropriate.

Embodiment 3

In this embodiment, a method for forming a microcrystalline semiconductor film according to an embodiment of the present invention, which is different from the methods described in Embodiments 1 and 2, will be described.

As described in Embodiment 1, in order not to form a microcrystalline semiconductor film over an end portion of a substrate, a large number of hydrogen radicals is generated in a region overlapping with the end portion of the substrate in a reaction chamber, so that a process in which a microcrystalline semiconductor film deposited by reaction species generated from a deposition gas is removed by the hydrogen radicals proceeds dominantly.

The method described in this embodiment is such that using a plasma CVD apparatus which includes a reaction chamber provided with a first electrode and a second electrode, the flow rate of hydrogen supplied to the reaction chamber and the high-frequency power supplied to the first electrode are set constant and the flow rate ratio of a deposition gas supplied to the reaction chamber to hydrogen supplied to the reaction chamber is increased and decreased; in this manner, the amount of hydrogen radicals generated in a region overlapping with the end portion of the substrate in the plasma region in the reaction chamber can be controlled.

The structure of a plasma CVD apparatus used in this embodiment is similar to that in Embodiment 1, and the process of transferring the substrate 240 to the reaction chamber 103 and setting the substrate 240 over the susceptor 205 is similar to that in Embodiment 1.

Next, a method for alternately increasing and decreasing the flow rate ratio of the deposition gas supplied to the reaction chamber 103 to hydrogen supplied to the reaction chamber 103 will be described with reference to FIG. 5.

Figure 5:
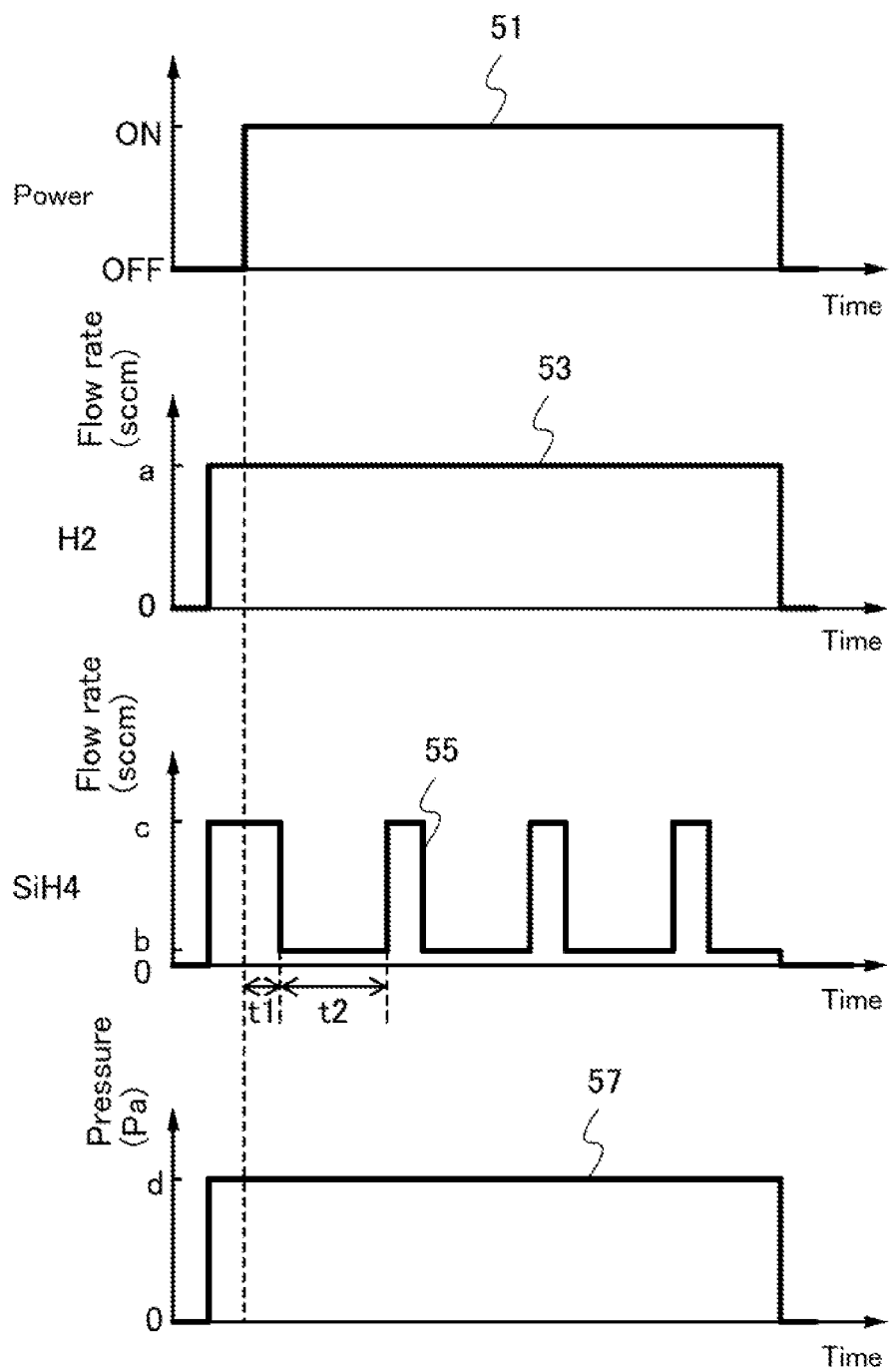
FIG. 5 is a timing chart showing an example of a formation method according to an embodiment of the present invention.

FIG. 5 is a timing chart showing temporal changes in the process for forming a microcrystalline semiconductor film using the above-described method. In FIG. 5, a solid line 51 indicates on/off states of the high-frequency power supply 204, a solid line 53 indicates the flow rate of hydrogen supplied to the reaction chamber 103, a solid line 55 indicates the flow rate of the deposition gas supplied to the reaction chamber 103, and a solid line 57 indicates a change of pressure in the reaction chamber 103. Note that the state in which the high-frequency power supply 204 supplies high-frequency power to the upper electrode 201 is the on state, while the state in which supply of high-frequency power to the upper electrode 201 is stopped is the off state.

First, the deposition gas containing silicon or germanium and hydrogen are supplied from the gas supply means 208 to the reaction chamber 103, and the pressure in the reaction chamber 103 to which the deposition gas and hydrogen are supplied is adjusted and kept constant. At this time, hydrogen is supplied to the reaction chamber 103 with a constant flow rate (with a flow rate α (sccm) in FIG. 5). The deposition gas can be selected as appropriate in a manner similar to that of Embodiment 1. In this embodiment, silane ($SiH_4$) that is a deposition gas containing silicon is used as the deposition gas. In addition, heating is performed with the substrate heater 214 so that the temperature of the substrate 240 becomes a predetermined temperature, and the temperature of the substrate 240 is kept at the predetermined temperature. The temperature of the substrate 240 is set to be room temperature to 350° C., preferably 150° C. to 280° C.

Next, the high-frequency power supply 204 is turned on to cause generation of plasma, and then the flow rate of the deposition gas supplied to the reaction chamber is alternately increased and decreased as shown by the solid line 55. In this specification, alternately increasing and decreasing the flow rate ratio of the deposition gas to hydrogen is called cycle flow. In this embodiment, after the high-frequency power supply 204 is turned on, a first period in which the deposition gas with a flow rate c (sccm) is supplied for $t_1$ seconds and a second period in which the deposition gas containing silicon or germanium with a flow rate b (sccm) (0<b<c) is supplied for $t_2$ seconds are repeated. Here, the $t_2$ seconds of the second period is longer than the $t_1$ seconds of the first period. The gap distance may be constant during the first period and the second period, and is set to such a distant that enables generation of plasma.

The mixing ratio of the deposition gas and hydrogen in the first period is set so that the flow rate of hydrogen is more than or equal to 50 times and less than or equal to 2000 times that of the deposition gas, preferably more than or equal to 1000 times and less than or equal to 2000 times that of the deposition gas. Further, in the second period, the flow rate b (sccm) of the deposition gas is more than 0 sccm and less than or equal to 0.3 sccm in order to increase the flow rate ratio of hydrogen to the deposition gas. With the flow rate b (sccm) of the deposition gas being the above-mentioned value, the effects described below can be obtained sufficiently.

Based on the description in Embodiment 1, it is preferable that the pressure d (Pa) in the reaction chamber in the first period be set to be higher than or equal to 5000 Pa and lower than or equal to 50000 Pa, preferably higher than or equal to 10000 Pa and lower than or equal to 50000 Pa. The pressure in the reaction chamber 103 in the second period may be the same as that in the first period; thus, the pressure may be kept constant during the cycle flow process.

The frequency of power supplied from the high-frequency power supply 204 used in the cycle flow process can be selected as appropriate based on the description in Embodiment 1. Here, the frequency is set to be 13.56 MHz, and the high-frequency power is set to be preferably higher than or equal to 100 W and lower than or equal to 1300 W, further preferably higher than or equal to 700 W and lower than or equal to 1300 W. As shown by the solid line 51 in FIG. 5, the high-frequency power is set to be always on during the cycle flow process.

Since the flow rate of the deposition gas in the second period is less than that in the first period, the flow rate ratio of hydrogen to the deposition gas in the second period is more than that in the first period. In other words, the number of reaction species generated from the deposition gas in the first period with a high flow rate of the deposition gas (the period with the flow rate c (sccm) in FIG. 5) is larger than that in the second period with a low flow rate of the deposition gas (the period with the flow rate b (sccm) in FIG. 5); accordingly, the process of depositing a microcrystalline semiconductor film proceeds dominantly in the first period, so that a microcrystalline semiconductor film is deposited over an entire surface of the substrate.

In contrast, the flow rate of the deposition gas is low in the second period, so that the process in which the microcrystalline semiconductor film deposited over the end portion of the substrate in the first period is selectively removed by hydrogen radicals generated from the deposition gas and hydrogen proceeds dominantly. Since the second period is longer than the first period, the microcrystalline semiconductor film deposited over the end portion of the substrate can be effectively removed.

Therefore, by alternating the first period and the second period, the microcrystalline semiconductor film is not formed over the end portion of the substrate and the microcrystalline semiconductor film can be formed over a region positioned more on the inside than the end portion of the substrate. Note that $t_1$ and $t_2$ are each preferably several seconds to several tens of seconds. When $t_1$ and $t_2$ are each several minutes, there arises a possibility that not only the microcrystalline semiconductor film deposited over the end portion of the substrate but also the microcrystalline semiconductor film deposited over the region positioned more on the inside than the end portion of the substrate may be removed.

Here, each of all the first periods, i.e., each of all periods in which the deposition gas flows with the flow rate c (sccm), takes $t_1$ seconds; however, all the first periods may take different times. Further, each of all the second periods, i.e., each of all periods in which the deposition gas flows with the flow rate b (b<c), takes $t_2$ seconds; however, all the second periods may take different times.

By increasing and decreasing the flow rate of the deposition gas while the high-frequency power supply 204 is kept on, the microcrystalline semiconductor film can be efficiently deposited over the substrate 240.

Here, the flow rate b (sccm) of the deposition gas has the relation: 0<b<c. However, the flow rate b (sccm) may be 0. That is, the first period in which the deposition gas is supplied and the second period in which the deposition gas is not supplied may be alternately provided.

In the second period, the pressure and the high-frequency power supplied from the high-frequency power supply 204 may be set higher than those in the first period. In this manner, the plasma density in the region overlapping with the end portion of the substrate 240 in the reaction chamber 103 can become high in the second period; accordingly, the microcrystalline semiconductor film deposited over the end portion of the substrate 240 can be effectively removed. The region where plasma is generated (plasma region) is at least a region where the upper electrode 201 and the lower electrode 202 overlap with each other. However, to be exact, because the susceptor 205 having the same potential as the lower electrode 202 is provided on the lower electrode 202, the plasma region is a region where the upper electrode 201 and the susceptor 205 overlap with each other. Thus, the plasma region is at least a region whose range is indicated by dotted line C-D in FIG. 2.

When a microcrystalline semiconductor film is formed using any of the methods described in this embodiment, Embodiment 1, and Embodiment 2, a crystal grain is included in the formed microcrystalline semiconductor film. The crystal grain is also called mixed phase grain. The mixed phase grain includes an amorphous semiconductor region and a crystallite which is a microcrystal that can be regarded as a single crystal. The mixed phase grain may include a twin crystal. Accordingly, the microcrystalline semiconductor film includes an amorphous semiconductor region. Further, since the microcrystalline semiconductor film includes mixed phase grains, many crystallites are included in the microcrystalline semiconductor film.

By the cycle flow, the microcrystalline semiconductor film deposited over the end portion of the substrate is selectively removed, but at the same time the amorphous semiconductor region included in the microcrystalline semiconductor film deposited over the substrate in the region positioned more on the inside than the end portion of the substrate is also removed in the second period in the cycle flow process. By the removal of the amorphous semiconductor region, crystallites are exposed.

The number of reaction species generated from the deposition gas in the first period in the cycle flow process is larger than that in the second period; accordingly, the process of depositing a microcrystalline semiconductor film proceeds dominantly in the first period. Thus, a microcrystalline semiconductor film is deposited over an entire surface of the substrate and at the same time crystal growth in which the exposed crystallites serve as nuclei proceeds.

By alternately repeating the above-described first period and second period in the cycle flow process, exposure of the crystallites owing to the dominant etching of the amorphous semiconductor region in the second period and the crystal growth in which the exposed crystallites are used as nuclei in the first period are alternately performed. Accordingly, the size of the crystallites in the mixed phase grains is increased.

Since the second period is longer than the first period, the amorphous semiconductor region included in the microcrystalline semiconductor is sufficiently removed; accordingly, the proportion of the amorphous semiconductor region in the microcrystalline semiconductor can be reduced. As a result, crystallinity of the formed microcrystalline semiconductor film can be increased.

By setting the pressure in the reaction chamber 103 to the above-described pressure in the cycle flow process, the mean free path of ions existing in the reaction chamber 103 is shortened, and the energy is lowered. Accordingly, ion damage to the microcrystalline semiconductor film that has been deposited or is under deposition is reduced and defects in the formed microcrystalline semiconductor film are reduced.

Before starting the cycle flow, a seed crystal in which the density of mixed phase grains is low may be formed over an entire surface of the substrate 240. In the case of forming the seed crystal in advance, the distance between the mixed phase grains in the seed crystal is long at the time of crystal growth by cycle flow in which the crystallites in the mixed phase grains serve as nuclei; accordingly, the crystal growth distance of the mixed phase grains can be long. Therefore, the size of the mixed phase grains can be increased, and the crystallinity of the formed microcrystalline semiconductor film can be increased. Formation conditions of the seed crystal may be determined as appropriate from the conditions of the mixing ratio of the deposition gas and hydrogen, the pressure in the reaction chamber 103, and the high-frequency power, which can be used in the first period in the cycle flow.

In a manner similar to that of Embodiment 1, at least one of a dilution gas and an additive gas may be added in addition to the deposition gas and the hydrogen gas which are source gases, in the method for forming a microcrystalline semiconductor film described in this embodiment.

In the above-described manner, a microcrystalline semiconductor film can be formed over a region positioned more on the inside than an end portion of a substrate so that the microcrystalline semiconductor film is not formed over the end portion of the substrate. Accordingly, when a semiconductor device including the microcrystalline semiconductor film is manufactured, peeling failures of the microcrystalline semiconductor film over the end portion of the substrate can be prevented; therefore, yield of the semiconductor device can be improved. Since the microcrystalline semiconductor film has high conductivity due to having high orientation and high crystallinity, when the method for forming a microcrystalline semiconductor film described in this embodiment is employed, a semiconductor device with favorable electrical characteristics can be manufactured with high productivity.

Note that the structure in this embodiment can be combined with any of the structures in the other embodiments as appropriate.

Embodiment 4

In this embodiment, a method for manufacturing a thin film transistor using any of the methods for forming a microcrystalline semiconductor film described in Embodiments 1 to 3 will be described.

A gate electrode 603 is formed over a substrate 601. Then, a gate insulating film 605 which covers the gate electrode 603 (also referred to as a first gate electrode) is formed. A seed crystal 607 is formed over the gate insulating film 605 (see FIG. 6A).

As the substrate 601, any of the substrates that can be used as the substrate 240 described in Embodiment 1 can be used as appropriate.

The gate electrode 603 can be formed having a single-layer structure or a layered structure using a metal material such as molybdenum, titanium, chromium, tantalum, tungsten, aluminum, copper, neodymium, scandium, or nickel or an alloy material which includes any of these materials as a main component. Further, a semiconductor typified by polycrystalline silicon doped with an impurity element such as phosphorus; an Ag—Pd—Cu alloy, an Al—Nd alloy, an Al—Ni alloy, or the like which contains an element for preventing hillocks may be used.

The following are preferable examples of the layered structure of the gate electrode 603: a two-layer structure in which a molybdenum film is provided over an aluminum film, a two-layer structure in which a molybdenum film is provided over a copper film, a two-layer structure in which a titanium nitride film or a tantalum nitride film is provided over a copper film, a two-layer structure in which a titanium nitride film and a molybdenum film are stacked, a two-layer structure in which a film of a copper-magnesium alloy containing oxygen and a copper film are stacked, a two-layer structure in which a film of a copper-manganese alloy containing oxygen and a copper film are stacked, a two-layer structure in which a copper-manganese alloy film and a copper film are stacked, or the like.

Other than the above two-layer structure, a three-layer structure in which a tungsten film or a tungsten nitride film, an alloy film of aluminum and silicon or an alloy film of aluminum and titanium, and a titanium nitride film or a titanium film are stacked may be used. By stacking a metal film serving as a barrier film over a film having low electric resistance in the above three-layer structure, electric resistance can be low and diffusion of metal elements from the metal film into the semiconductor film can be prevented.

Alternatively, the gate electrode 603 may have a layered structure in which titanium, tantalum, molybdenum, tungsten, or a nitride film of any of the elements is formed over the semiconductor typified by polycrystalline silicon doped with an impurity element such as phosphorus and aluminum or an aluminum alloy is formed thereover.

The gate electrode 603 can be formed in the following manner: a conductive film is formed over the substrate 601 by a sputtering method or a vacuum evaporation method using any of the above materials; a mask is formed over the conductive film by a photolithography method, an inkjet method, or the like; and the conductive film is etched using the mask. Alternatively, the conductive film formed into the gate electrode 603 can be formed by discharging a conductive nanopaste of silver, gold, copper, or the like over the substrate 601 by a screen printing method or an inkjet method and baking the conductive nanopaste. In order to improve adhesion between the gate electrode 603 and the substrate 601, a nitride film of any of the above metal materials may be provided between the substrate 601 and the gate electrode 603. In this embodiment, for forming the gate electrode 603, a conductive film is formed over the substrate 601 and etched using a resist mask formed by a photolithography method.

A side surface of the gate electrode 603 preferably has a tapered shape in order to prevent insulating films (the gate insulating film 605 and an insulating film 637 described later), a semiconductor film described later, and a wiring described later formed over the gate electrode 603 in later steps from being cut at a step portion of the gate electrode 603. To form the gate electrode 603 having a tapered shape, etching may be performed while the resist mask is made to recede.

In this specification, resist masks are removed after etching even in the case where removal of the resist masks is not written in this specification.

For example, in the case of using a thin film transistor of this embodiment as a switching element of a pixel in an active matrix liquid crystal display device, a gate wiring (scan line) and a capacitor wiring can also be formed in the same step for forming the gate electrode 603. Note that the scan line refers to a wiring for selecting a pixel in the active matrix liquid crystal display device, and the capacitor wiring refers to a wiring which is connected to one of electrodes of a storage capacitor in the pixel. However, without limitation thereto, the gate electrode 603 and one of or both the gate wiring and the capacitor wiring may be formed in separate steps.

The gate insulating film 605 (also referred to as a first gate insulating film) is formed having a single-layer structure or a layered structure using an insulating material such as silicon nitride, silicon nitride oxide, silicon oxynitride, or silicon oxide, for example. Here, a two-layer structure in which a silicon oxynitride film is stacked over a silicon nitride film is employed. By forming the gate insulating film 605 using an oxide insulating film such as silicon oxide or silicon oxynitride, fluctuation in threshold voltage of the thin film transistor can be reduced.

Note that "silicon nitride oxide" contains more nitrogen than oxygen and, in the case where measurements are performed using Rutherford backscattering spectrometry (RBS) and hydrogen forward scattering (HFS), preferably contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

"Silicon oxynitride" contains more oxygen than nitrogen and, in the case where measurements are performed using RBS and HFS, preferably contains oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively.

Note that percentages of nitrogen, oxygen, silicon, and hydrogen fall within the ranges given above, where the total number of atoms contained in the silicon oxynitride or the silicon nitride oxide is defined as 100 at. %.

The gate insulating film 605 can be formed by a CVD method (including a plasma CVD method), a sputtering method, or the like. In the case of forming the gate insulating film 605 by a plasma CVD method, the plasma CVD apparatus described in Embodiment 1 can be used as appropriate. When the gate insulating film 605 is formed using a microwave plasma CVD apparatus with a frequency of a high-frequency power supply of 1 GHz or more instead of using the plasma CVD apparatus described in Embodiment 1, the breakdown voltage between the gate electrode 603 and the drain and source electrodes formed later can be improved, whereby a highly reliable thin film transistor can be manufactured.

Further, by forming a silicon oxide film by a CVD method using an organosilane gas as the gate insulating film 605, the crystallinity of a microcrystalline semiconductor film which is formed later can be increased, whereby the on-state current and the field-effect mobility of the thin film transistor can be increased. Examples of the organosilane gas include silicon-containing compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), and trisdimethylaminosilane ($SiH(N(CH_3)_2)_3$).

The seed crystal 607 can be formed under conditions that enable the density of mixed phase grains to be low and the crystallinity of the mixed phase grains to be high, as described in Embodiment 3. Here, since silane gas is used as a deposition gas of a source gas, the seed crystal 607 includes mixed phase grains including silicon.

As described in the above embodiment, by adding a dilution gas containing a rare gas element such as helium, argon, neon, krypton, or xenon to the source gas of the seed crystal 607, crystallinity of the seed crystal 607 can be increased. By using such a seed crystal having high crystallinity, the on-state current and the field-effect mobility of the thin film transistor can be increased.

Next, a microcrystalline semiconductor film 609 is formed over the seed crystal 607. The microcrystalline semiconductor film 609 is formed so that a space between the mixed phase grains in the seed crystal 607 is filled and crystal growth is promoted, by using a method in which the flow rate ratio of hydrogen to a deposition gas of a source gas is alternately increased and decreased in a manner as described in Embodiment 3 (see FIG. 6B). Here, since silane gas is used as the deposition gas of the source gas, the microcrystalline semiconductor film 609 is a microcrystalline semiconductor film containing silicon.

By forming the seed crystal 607 and the microcrystalline semiconductor film 609 using the methods described in Embodiment 3 in this manner, peeling failures of the seed crystal 607 and the microcrystalline semiconductor film 609 over the end portion of the substrate 601 can be prevented; therefore, yield of the thin film transistor can be improved. Alternatively, the microcrystalline semiconductor film 609 may be formed using the method described in any of Embodiments 1 to 3 without forming the seed crystal 607. The usage of the method described in any of Embodiments 1 to 3 can also improve yield of the thin film transistor.

By adding a dilution gas containing any of the above-described rare gas elements to the source gas also in the step for forming the microcrystalline semiconductor film 609, crystallinity of the microcrystalline semiconductor film 609 can be increased as in the case of the seed crystal 607. Thus, the on-state current and the field-effect mobility of the thin film transistor can be increased.

Then, a semiconductor film 611 is formed over the microcrystalline semiconductor film 609. The semiconductor film 611 includes a microcrystalline semiconductor region 611a and an amorphous semiconductor region 611b. Then, an impurity semiconductor film 613 is formed over the semiconductor film 611. Then, a resist mask 615 is formed over the impurity semiconductor film 613 (see FIG. 6C).

The semiconductor film 611 including the microcrystalline semiconductor region 611a and the amorphous semiconductor region 611b can be formed by employing a condition which causes partial crystal growth using the microcrystalline semiconductor film 609 as a nucleus (i.e., a condition under which the crystal growth is reduced). The seed crystal 607, the microcrystalline semiconductor film 609, and the microcrystalline semiconductor region 611a function as a channel region.

The semiconductor film 611 is formed in a reaction chamber of a plasma CVD apparatus using a mixture of a deposition gas containing silicon or germanium, hydrogen, and a gas containing nitrogen. Examples of the gas containing nitrogen include ammonia, nitrogen, nitrogen fluoride, nitrogen chloride, chloroamine, fluoroamine, and the like. As the plasma CVD apparatus, the plasma CVD apparatus described in Embodiment 1 may be used.

At this time, the flow rate ratio of hydrogen to the deposition gas containing silicon or germanium is such a flow rate ratio as to form a microcrystalline semiconductor film as in the case of forming the seed crystal 607 and the microcrystalline semiconductor film 609. Here, by further adding a gas containing nitrogen in addition to the deposition gas and hydrogen having the above flow rate ratio, the semiconductor film 611 can be formed in the step of reducing the crystal growth of the seed crystal 607 and the microcrystalline semiconductor film 609.

Specifically, since a gas containing nitrogen is included as the source gas, the crystal growth is partly suppressed at an early stage of the deposition of the semiconductor film 611; thus, a conical or pyramidal microcrystalline semiconductor region grows, and an amorphous semiconductor region is formed. Furthermore, at a middle stage or later stage of the deposition of the semiconductor film 611, the crystal growth of the conical or pyramidal microcrystalline semiconductor region stops, and only an amorphous semiconductor region is deposited. As a result, in the semiconductor film 611, the microcrystalline semiconductor region 611a and the well-ordered amorphous semiconductor region 611b which has fewer defects and a steep tail of a level at a band edge in the valence band, can be formed.

Here, a typical example of a condition for forming the semiconductor film 611 is a condition in which the flow rate of hydrogen is 10 times to 2000 times, preferably 10 times to 200 times that of the deposition gas containing silicon or germanium. Note that in a typical example of a condition for forming a normal amorphous semiconductor film, the flow rate of hydrogen is 0 times to 5 times that of the deposition gas containing silicon or germanium. In this embodiment, silane gas is used as the deposition gas.

By adding a dilution gas containing a rare gas element such as helium, argon, neon, krypton, or xenon into the source gas of the semiconductor film 611, the deposition rate can be increased.

The thickness of the semiconductor film 611 is preferably more than or equal to 50 nm and less than or equal to 350 nm, further preferably more than or equal to 120 nm and less than or equal to 250 nm.

Figure 6A:
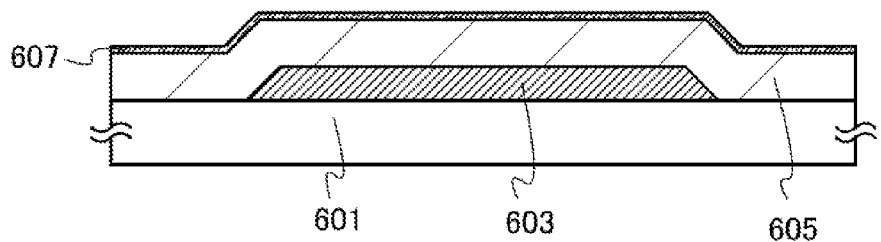
FIGS. 6A to 6D are cross-sectional views illustrating an example of a method for manufacturing a semiconductor device according to an embodiment of the present invention.
Figure 6B:
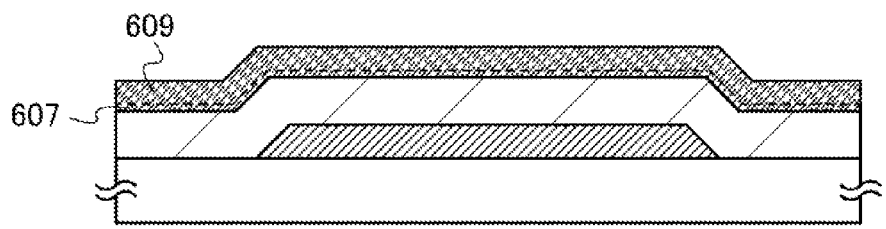
Figure 6C:
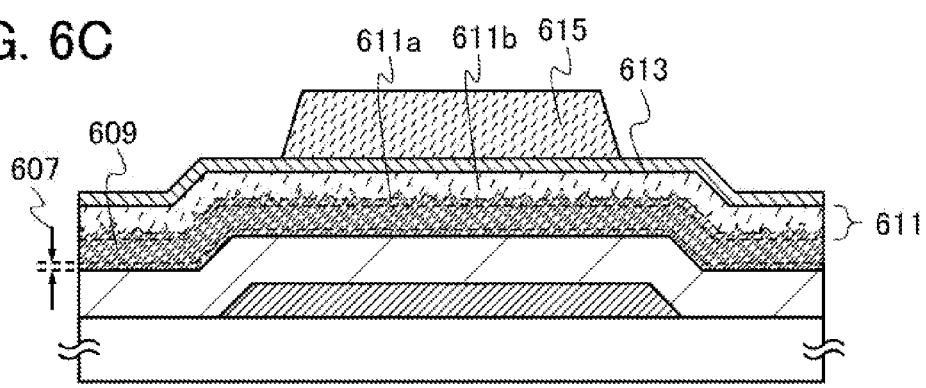
Figure 7A:
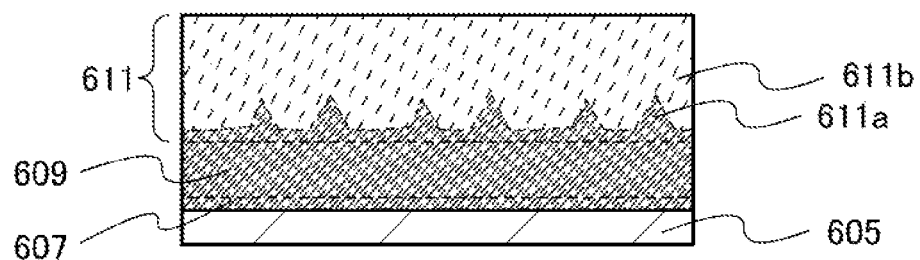
FIGS. 7A and 7B are cross-sectional views illustrating examples of a method for manufacturing a semiconductor device according to an embodiment of the present invention.
Figure 7B:
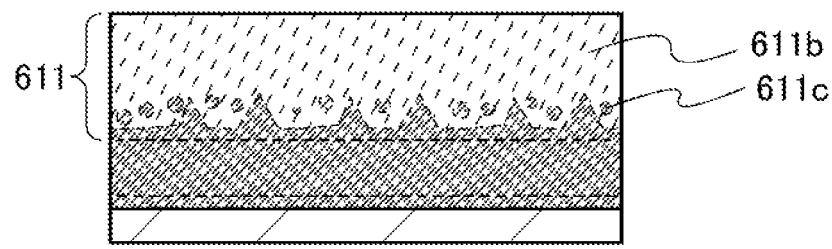

FIGS. 7A and 7B are enlarged views of a layered structure from the gate insulating film 605 to the semiconductor film 611 illustrated in FIG. 6C.

As illustrated in FIG. 7A, the microcrystalline semiconductor region 611a in the semiconductor film 611 has a projection and a depression; the projection has a conical or pyramidal shape whose width decreases from the gate insulating film 605 side toward the amorphous semiconductor region 611b side (a tip of the projection has an acute angle). Note that the microcrystalline semiconductor region 611a may have a projection whose width increases from the gate insulating film 605 side toward the amorphous semiconductor region 611b side (an inverted conical or pyramidal shape). The microcrystalline semiconductor region 611a is formed of a microcrystalline semiconductor containing silicon because silane gas is used as the deposition gas.

By setting the thickness of the seed crystal 607, the microcrystalline semiconductor film 609, and the microcrystalline semiconductor region 611a, that is, the distance from the interface between the gate insulating film 605 and the seed crystal 607 to the tip of the projection of the microcrystalline semiconductor region 611a to greater than or equal to 5 nm and less than or equal to 310 nm, the projection of the microcrystalline semiconductor region 611a is not in contact with an impurity semiconductor film that is formed later; accordingly, the off-state current of the thin film transistor can be reduced. By providing the microcrystalline semiconductor region 611a having a projection and a depression in an interface region between the microcrystalline semiconductor film 609 and the semiconductor film 611, resistance in the vertical direction (the film thickness direction) of the thin film transistor, that is, resistance between the semiconductor film 611 and the microcrystalline semiconductor film 609 can be reduced. Accordingly, the on-state current and the field-effect mobility of the thin film transistor can be increased.

The amorphous semiconductor region 611b is formed of an amorphous semiconductor containing nitrogen. Nitrogen in the amorphous semiconductor containing nitrogen may exist, for example, as an NH group or an $NH_2$ group. In this embodiment, the amorphous semiconductor is amorphous silicon because silane gas is used as the deposition gas for forming the semiconductor film 611.

The amorphous semiconductor containing nitrogen is a semiconductor having lower energy at an Urbach edge measured by a constant photocurrent method (CPM) or photoluminescence spectroscopy and a smaller amount of absorption spectra of defective levels as compared to a conventional amorphous semiconductor. In other words, as compared to the conventional amorphous semiconductor, the amorphous silicon containing nitrogen is a well-ordered semiconductor having fewer defects and a steep tail of a level at a band edge in the valence band. Since the amorphous semiconductor containing nitrogen has a steep tail of a level at a band edge in the valence band, the band gap is wide and tunnel current does not flow easily. Therefore, when the amorphous semiconductor containing nitrogen is provided between the microcrystalline semiconductor region 611a and the impurity semiconductor film formed later, the off-state current of the thin film transistor can be reduced.

Further, a peak of a spectrum of the amorphous semiconductor containing nitrogen obtained by low-temperature photoluminescence spectroscopy is greater than or equal to 1.31 eV and less than or equal to 1.39 eV. Note that a peak region of a spectrum of a microcrystalline semiconductor, typically microcrystalline silicon, obtained by low-temperature photoluminescence spectroscopy is greater than or equal to 0.98 eV and less than or equal to 1.02 eV, which shows that an amorphous semiconductor containing nitrogen is different from a microcrystalline semiconductor.

An NH group or an $NH_2$ group may exist in the microcrystalline semiconductor region 611a, as well as in the amorphous semiconductor region 611b. This is because defects are reduced and carriers flow easily when nitrogen, in particular, an NH group or an $NH_2$ group is bonded (cross-linked) with dangling bonds of silicon atoms in an interface region between crystal grains included in the microcrystalline semiconductor region 611a or in an interface region between the microcrystalline semiconductor region 611a and the amorphous semiconductor region 611b. As a result, a bond which promotes the carrier transfer is formed at a crystal grain boundary or a defect, whereby the carrier mobility in the interface region is increased. Thus, the field-effect mobility of the thin film transistor is increased.

It is preferable that the concentration of oxygen and nitrogen contained in the semiconductor film 611, which is measured by secondary ion mass spectrometry (SIMS), be less than $1 \times 10^{18}$ atoms/cm$^3$ because crystallinity of the microcrystalline semiconductor region 611a can be increased. By reducing the concentration of oxygen included in the semiconductor film 611, defects can be reduced in the interface between crystal grains included in the microcrystalline semiconductor region 611a or at the interface between the microcrystalline semiconductor region 611a and the amorphous semiconductor region 611b; accordingly, bonds which inhibit carrier transfer can be reduced.

Further, when a semiconductor mixed phase grain 611c whose grain size is greater than or equal to 1 nm and less than or equal to 10 nm, preferably greater than or equal to 1 nm and less than or equal to 5 nm is included in the amorphous semiconductor region 611b as illustrated in FIG. 7B, the on-state current and the filed-effect mobility of the thin film transistor can be further increased.

Here, the semiconductor film 611 including the microcrystalline semiconductor region 611a and the amorphous semiconductor region 611b is formed using the source gas including the gas containing nitrogen. Alternatively, the semiconductor film 611 including the microcrystalline semiconductor region 611a and the amorphous semiconductor region 611b can be formed in the following manner: the top surface of the microcrystalline semiconductor film 609 is exposed to a gas containing nitrogen so that nitrogen is adsorbed to the top surface of the microcrystalline semiconductor film 609, and then film deposition of the semiconductor film 611 including the microcrystalline semiconductor region 611a and the amorphous semiconductor region 611b is performed using hydrogen and a deposition gas containing silicon or germanium.

The impurity semiconductor film 613 is formed using a semiconductor to which an impurity element imparting one conductivity type is added. In the case of manufacturing an n-channel thin film transistor, phosphorus (P) or arsenic (As) may be added as the impurity element imparting one conductivity type as described in the above embodiment. In the case of manufacturing a p-channel thin film transistor, boron (B) may be added as described in the above embodiment. The impurity semiconductor film 613 may have a single-layer structure including amorphous semiconductor, microcrystalline semiconductor, or the like or a layered structure including amorphous semiconductor and microcrystalline semiconductor.

In the case where the semiconductor film 611 forms an ohmic contact with wirings 629a and 629b which are formed later and function as a source electrode and a drain electrode, the impurity semiconductor film 613 is not necessarily formed.

Here, the impurity semiconductor film 613 is formed of amorphous silicon to which phosphorus is added or microcrystalline silicon to which phosphorus is added, by a plasma CVD method in a reaction chamber of the plasma CVD apparatus using a mixture of hydrogen, phosphine (diluted with hydrogen or silane), and a deposition gas containing silicon as a source gas. In the case of manufacturing a p-channel thin film transistor, the impurity semiconductor film 613 may be formed by a plasma CVD method using diborane instead of phosphine. As the plasma CVD apparatus, the plasma CVD apparatus described in Embodiment 1 may be used.

Further, in the case where the impurity semiconductor film 613 is formed using microcrystalline silicon to which phosphorus is added or microcrystalline silicon to which boron is added, a microcrystalline semiconductor film, typically a microcrystalline silicon film, is formed between the semiconductor film 611 and the impurity semiconductor film 613, so that characteristics of the interface can be improved. As a result, resistance generated at the interface between the purity semiconductor film 613 and the semiconductor film 611 can be reduced. Therefore, the amount of current flowing between the source electrode and the drain electrode through the channel region of the thin film transistor can be increased and the on-state current and the field-effect mobility can be increased.

The resist mask 615 can be formed by a photolithography step.

Next, the seed crystal 607, the microcrystalline semiconductor film 609, the semiconductor film 611, and the impurity semiconductor film 613 are selectively etched using the resist mask 615. Through this step, the seed crystal 607, the microcrystalline semiconductor film 609, the semiconductor film 611, and the impurity semiconductor film 613 are divided for each element, whereby an island-shaped semiconductor stacked body 617 and an island-shaped impurity semiconductor film 621 are formed. The semiconductor stacked body 617 includes a microcrystalline semiconductor region 617a which includes part of the seed crystal 607, part of the microcrystalline semiconductor film 609, and part of the microcrystalline semiconductor region 611a of the semiconductor film 611; and an amorphous semiconductor region 617b which includes part of the amorphous semiconductor region 611b of the semiconductor film 611. Then, the resist mask 615 is removed (see FIG. 6D).

Figure 8A:
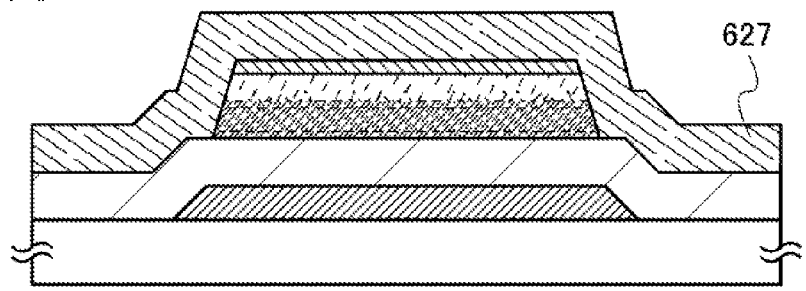
FIGS. 8A to 8C are cross-sectional views illustrating an example of a method for manufacturing a semiconductor device according to an embodiment of the present invention.

Next, a conductive film 627 is formed over the impurity semiconductor film 621 (see FIG. 8A). The conductive film 627 can be formed using any of the metal materials and the alloy materials that can be used for the gate electrode 603. The conductive film 627 is formed by a sputtering method or a vacuum evaporation method. Alternatively, the conductive film 627 may be formed by discharging a conductive nanopaste of silver, gold, copper, or the like by a screen printing method, an inkjet method, or the like and baking the conductive nanopaste.

Figure 8B:
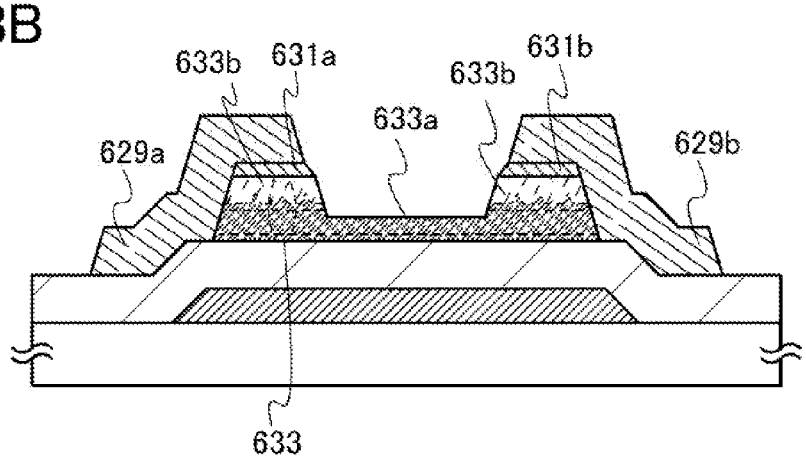

Then, a resist mask is formed by a photolithography step, and the conductive film 627 is etched with the use of the resist mask, whereby the wirings 629a and 629b serving as a source electrode and a drain electrode are formed (see FIG. 8B). The etching of the conductive film 627 may be either dry etching or wet etching.

Note that in the case of using the thin film transistor of this embodiment as a switching element of a pixel in an active matrix liquid crystal display device, one of the wirings 629a and 629b functions not only as a source or drain electrode but also a signal line. However, without limitation thereto, the signal line and the source or drain electrode may be formed in separate steps.

Then, the impurity semiconductor film 621 and the semiconductor stacked body 617 are partly etched, whereby a pair of impurity semiconductor films 631a and 631b serving as a source and drain regions is formed. Also, a semiconductor stacked body 633 including a microcrystalline semiconductor region 633a and a pair of amorphous semiconductor regions 633b is formed. At this point, the semiconductor stacked body 617 is etched so that the microcrystalline semiconductor region 633a is exposed, whereby the semiconductor stacked body 633 having the following structure is formed: in regions which are covered with the wirings 629a and 629b, the microcrystalline semiconductor region 633a and the pair of amorphous semiconductor regions 633b are stacked, and in a region which is covered with neither the wiring 629a nor the wiring 629b and overlaps with at least the gate electrode 603, the microcrystalline semiconductor region 633a is exposed.

Here, ends of the wirings 629a and 629b and the ends of the impurity semiconductor films 631a and 631b are not aligned with each other and, in the cross-section, there are steps between the ends of the wirings 629a and 629b and the ends of the pair of impurity semiconductor films 631a and 631b. However, the ends of the wirings 629a and 629b may be aligned with the ends of the impurity semiconductor films 631a and 631b.

Next, dry etching may be performed on the structure obtained so far. The dry etching is performed under a condition where the exposed microcrystalline semiconductor region 633a and the exposed pair of amorphous semiconductor regions 633b are not damaged and the etching rates of the microcrystalline semiconductor region 633a and the pair of amorphous semiconductor regions 633b are low. As an etching gas, $Cl_2$, $CF_4$, $N_2$, or the like is typically used. There is no particular limitation on an etching method, and an inductively coupled plasma (ICP) method, a capacitively coupled plasma (CCP) method, an electron cyclotron resonance (ECR) method, a reactive ion etching (RIE) method, or the like can be used.

Then, the surfaces of the microcrystalline semiconductor region 633a and the pair of amorphous semiconductor regions 633b are subjected to plasma treatment typified by water plasma treatment, oxygen plasma treatment, ammonia plasma treatment, nitrogen plasma treatment, plasma treatment using a mixed gas of oxygen and hydrogen, or the like.

After that, the resist mask is removed. The resist mask may be removed before the dry etching of the impurity semiconductor film 621 and the semiconductor stacked body 617.

As described above, after the microcrystalline semiconductor region 633a and the pair of amorphous semiconductor regions 633b are formed, dry etching is additionally performed under a condition where the microcrystalline semiconductor region 633a and the pair of amorphous semiconductor regions 633b are not damaged, whereby an impurity such as a residue over the exposed microcrystalline semiconductor region 633a and the exposed pair of amorphous semiconductor regions 633b can be removed. Further, after the dry etching, water plasma treatment or plasma treatment using a mixed gas of oxygen and hydrogen is successively performed, whereby a residue of the resist mask can be removed and defects of the microcrystalline semiconductor region 633a can be reduced. Further, by the plasma treatment, a higher insulating property between the source region and the drain region can be obtained. Thus, in the resulting thin film transistors, off-state current can be reduced and a variation in electrical characteristics among thin film transistor elements which are separated over the substrate 240 can be reduced.

Note that the resist mask is formed by a photolithography step over the conductive film 627, and the conductive film 627 is etched using the resist mask; whereby the wirings 629a and 629b serving as the source and drain electrodes are formed. Then, the impurity semiconductor film 621 is etched, whereby the pair of impurity semiconductor films 631a and 631b serving as the source and drain regions is formed. At this time, part of the semiconductor stacked body 617 is etched in some cases. Then, after the resist mask is removed, the semiconductor stacked body 617 may be partly etched using the wirings 629a and 629b serving as the source and drain electrodes as masks, to form the semiconductor stacked body 633 including the microcrystalline semiconductor region 633a and the pair of amorphous semiconductor regions 633b.

Since the microcrystalline semiconductor region 617a is covered with the amorphous semiconductor region 617b in the step of removing the resist mask, the microcrystalline semiconductor region 617a is prevented from being in contact with a resist stripper and a residue of the resist. Further, since the amorphous semiconductor region 617b is etched using the wirings 629a and 629b to expose the microcrystalline semiconductor region 633a after the resist mask is removed, the amorphous semiconductor region which is in contact with the resist stripper and a residue of the resist is not left in a back channel. Consequently, leakage current is not generated, which may be generated in the case where the resist stripper and the residue of the resist are left on the back channel; accordingly, the off-state current of the thin film transistor can be further reduced. Note that in this specification, the backchannel means a channel formed in a region that is not in contact with the first gate insulating film (the gate insulating film 605) in the channel formation region.

Through the above-described process, a single-gate thin film transistor can be manufactured. With the structure and the manufacturing method described in this embodiment, a single-gate thin film transistor with low off-state current, high on-state current, and high field-effect mobility can be manufactured with high productivity.

Then, an insulating film (also referred to as a second gate insulating film) 637 is formed over the semiconductor stacked body 633, the pair of impurity semiconductor films 631a and 631b, and the wirings 629a and 629b. The insulating film 637 can be formed in a manner similar to that of the gate insulating film 605.

Then, an opening (not illustrated) is formed in the insulating film 637 with the use of a resist mask formed by a photolithography step. Then, a back gate electrode (also referred to as a second gate electrode) 639 is formed over the insulating film 637 (see FIG. 8C). Through the above-described process, a dual-gate thin film transistor can be manufactured. Although not shown, in the case of using the dual-gate thin film transistor as a switching element of a pixel in an active matrix liquid crystal display device, a pixel electrode connected to one of the wirings 629a and 629b can be formed at the same time as the formation of the back gate electrode 639.

The back gate electrode 639 can be formed in a manner similar to that of the wirings 629a and 629b. The back gate electrode 639 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

Alternatively, the back gate electrode 639 can be formed using a conductive composition including a conductive high molecule (also referred to as a conductive polymer) having a light-transmitting property. The back gate electrode 639 preferably has a sheet resistance of 10000 Ω/sq. or less and a light transmittance of 70% or greater at a wavelength of 550 nm. Further, the resistivity of the conductive high molecule included in the conductive composition is preferably 0.1Ω·cm or less.

As the conductive high molecule, a so-called π-electron conjugated conductive high molecule can be used. For example, polyaniline and a derivative thereof, polypyrrole and a derivative thereof, polythiophene and a derivative thereof, and a copolymer of two or more of aniline, pyrrole, and thiophene and a derivative thereof can be given.

The bad gate electrode 639 can be formed by forming a conductive film using any of the above materials by a sputtering method or a vacuum evaporation method, and then etching the conductive film using a resist mask formed by a photolithography step. Alternatively, the back gate electrode 639 can be formed by discharging a conductive nanopaste of silver, gold, copper, or the like by a screen printing method, an inkjet method, or the like and baking the conductive nanopaste.

Next, the shape of the back gate electrode will be described with reference to FIGS. 9A to 9D which are plan views of thin film transistors. In FIGS. 9A to 9D, the gate insulating film 605 and the insulating film 637 are not illustrated for simplicity.

As illustrated in FIG. 9A, the back gate electrode 639 can be formed in parallel to the gate electrode 603. In this case, potential applied to the back gate electrode 639 and potential applied to the gate electrode 603 can be controlled independently. Thus, the threshold voltage of the thin film transistor can be controlled. Further, regions in which carriers flow, that is, channel regions are formed on the gate insulating film 605 side and on the insulating film 637 side in the microcrystalline semiconductor region 633*a*; thus, the on-state current of the thin film transistor can be increased.

As illustrated in FIG. 9B, the back gate electrode 639 can be connected to the gate electrode 603. That is, the gate electrode 603 and the back gate electrode 639 can be connected through an opening 650 formed in the gate insulating film 605 and the insulating film 637. In this case, potential applied to the back gate electrode 639 and potential applied to the gate electrode 603 are equal. Therefore, regions in which carriers flow, that is, channel regions are formed on the gate insulating film 605 side and on the insulating film 637 side in the microcrystalline semiconductor region 633*a*; thus, the on-state current of the thin film transistor can be increased.

Further alternatively, as illustrated in FIG. 9C, a structure in which the back gate electrode 639 is not connected to the gate electrode 603 and is in a floating state can be employed. In that case, channel regions are formed on the gate insulating film 605 side and on the insulating film 637 side in the microcrystalline semiconductor region 633*a* without application of potential to the back gate electrode 639; thus, the on-state current of the thin film transistor can be increased.

Further, as illustrated in FIG. 9D, the back gate electrode 639 may overlap with the wirings 629*a* and 629*b* with the insulating film 637 provided therebetween. Although the back gate electrode 639 of FIG. 9A is used in FIG. 9D, it is possible that the back gate electrode 639 of FIG. 9B or FIG. 9C overlap with the wirings 629*a* and 629*b*.

In the single-gate thin film transistor and the dual-gate thin film transistor described in this embodiment, the microcrystalline semiconductor film is formed over a region positioned more on the inside than an end portion of the substrate so that the microcrystalline semiconductor film is not formed over the end portion of the substrate. Accordingly, when the thin film transistor is manufactured, peeling failures of the microcrystalline semiconductor film over the end portion of the substrate can be prevented; therefore, yield of the thin film transistor can be improved.

In each of the single-gate thin film transistor and the dual-gate thin film transistor which are described in this embodiment, a channel region can be formed using a microcrystalline semiconductor film whose crystallinity is increased by reduction of a space between mixed phase grains. Therefore, the number of carriers that move in the single-gate thin film transistor is increased, so that the on-state current and the field-effect mobility can be increased. Further, in the dual-gate thin film transistor, since the microcrystalline semiconductor film having high crystallinity not only on the first gate insulating film side but also on the second gate insulating film side is used as the channel region, the number of carriers that move is increased, so that the on-state current and the field-effect mobility can be increased. Furthermore, since the pair of amorphous semiconductor regions 633*b* is provided between the microcrystalline semiconductor region 633*a* and the pair of impurity semiconductor films 631*a* and 631*b*, the off-state current of the thin film transistor can be reduced. Accordingly, the area of the single-gate thin film transistor and the area of the dual-gate thin film transistor can be reduced, which enables miniaturization of a highly-integrated semiconductor device including such a thin film transistor. Further, when the thin film transistor described in this embodiment is used for a driver circuit of a display device, the area of the driver circuit can be decreased, which enables the frame of the display device to be narrowed.

Note that the structure in this embodiment can be combined with any of the structures in the other embodiments as appropriate.

Embodiment 5

In this embodiment, a method for manufacturing a thin film transistor, by which the off-state current can be further reduced as compared to the off-state current in Embodiment 4, will be described with reference to FIGS. 6A to 6D, FIGS. 8A to 8C, and FIGS. 10A to 10C.

As in Embodiment 4, the semiconductor stacked body 617 is formed through the process illustrated in FIGS. 6A to 6C.

Figure 10A:
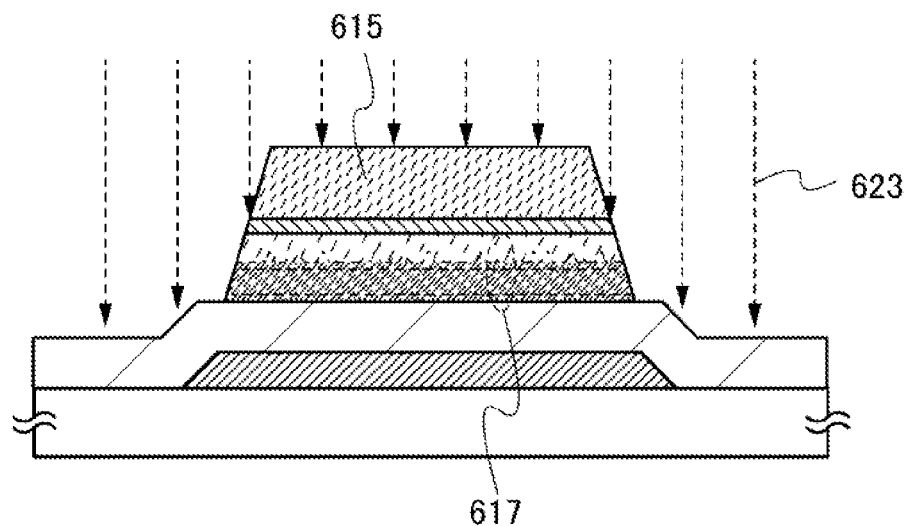
FIGS. 10A to 10C are cross-sectional views illustrating an example of a method for manufacturing a semiconductor device according to an embodiment of the present invention.

Next, plasma treatment is performed in which a side surface of the semiconductor stacked body 617 is exposed to plasma 623 with the resist mask 615 left (see FIG. 10A). Here, plasma is generated in an oxidizing gas atmosphere or a nitriding gas atmosphere, and the semiconductor stacked body 617 is exposed to the plasma 623. Examples of the oxidizing gas include oxygen, ozone, water vapor, and a mixed gas of oxygen and hydrogen. Examples of the nitriding gas include nitrogen, ammonia, nitrogen fluoride, nitrogen chloride, chloroamine, and fluoroamine. By generating plasma in an oxidizing gas or a nitriding gas, a radical is generated. The radical reacts with the semiconductor stacked body 617, so that an insulating region that is an oxide or nitride is formed on the side surface of the semiconductor stacked body 617. Note that instead of irradiation with plasma, irradiation with ultraviolet light may be performed for generation of a radical.

Figure 10B:
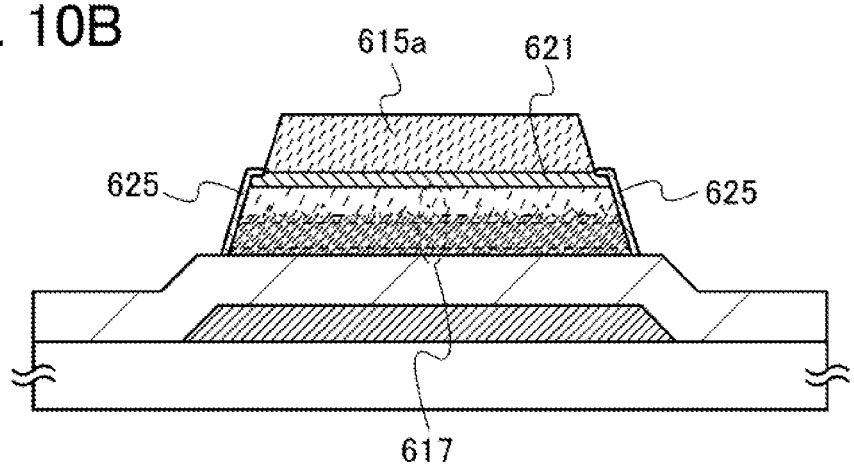
Figure 10C:
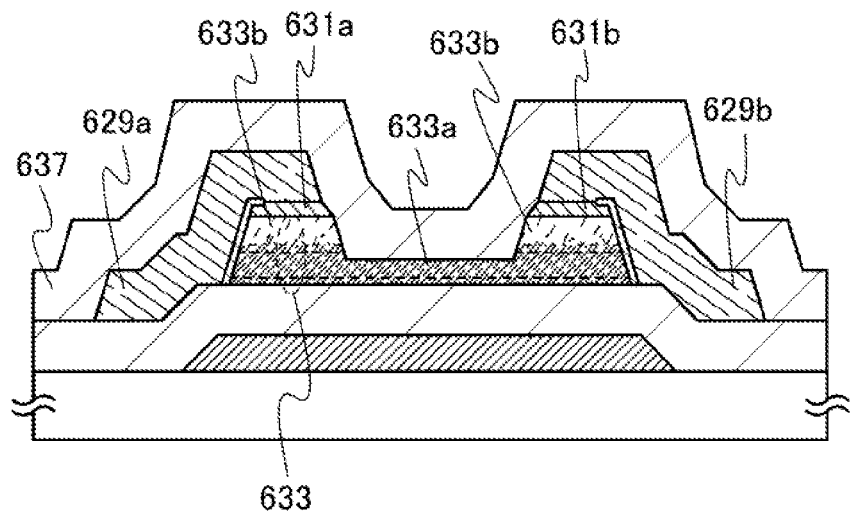

In the case of using oxygen, ozone, water vapor, or a mixed gas of oxygen and hydrogen as the oxidizing gas, the resist recedes by plasma irradiation, whereby a resist mask 615*a* having a smaller top surface is formed as illustrated in FIG. 10B. Consequently, through the plasma treatment, the exposed impurity semiconductor film 621 is oxidized in addition to the side surface of the semiconductor stacked body 617, whereby an insulating region 625 that is an oxide or nitride is formed on the side surface of the semiconductor stacked body 617 and on the side surface and part of the top surface of the impurity semiconductor film 621.

Figure 6D:
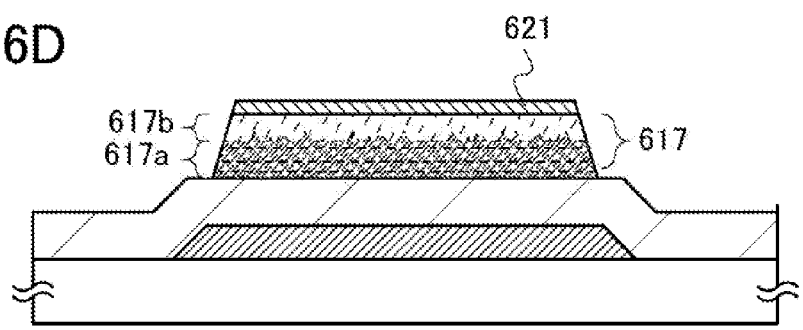

Instead of forming the insulating region 625, a sidewall insulating film in contact with the side surface of the semiconductor stacked body 617 may be formed in the following manner: an oxide insulating film or a nitride insulating film is formed to cover the semiconductor stacked body 617 in that state where the resist mask 615 is removed as illustrated in FIG. 6D and the insulating film is subjected to highly anisotropic etching, that is, etching in a direction perpendicular to a surface of the substrate 601.

Next, as described in Embodiment 4, through the process illustrated in FIGS. 8A and 8B, the wirings 629a and 629b serving as a source electrode and a drain electrode, the pair of impurity semiconductor films 631a and 631b serving as a source region and a drain region, the semiconductor stacked body 633 including the microcrystalline semiconductor region 633a and the pair of amorphous semiconductor regions 633b, and the insulating film 637 are formed. Thus, a single-gate thin film transistor can be manufactured (see FIG. 10C).

Although not shown, when a back gate electrode is formed over the insulating film 637, a dual-gate thin film transistor can be manufactured.

In the single-gate thin film transistor and the dual-gate thin film transistor which are described in this embodiment, a channel region can be formed using a microcrystalline semiconductor film whose crystallinity is increased by reduction of a space between mixed phase grains. Furthermore, by providing the insulating region 625 that is an oxide or a nitride between the semiconductor stacked body 633 and the wirings 629a and 629b, holes injected from the wirings 629a and 629b to the semiconductor stacked body 633 can be reduced; thus, a thin film transistor having a smaller off-state current than that in Embodiment 4 can be manufactured.

Note that the structure in this embodiment can be combined with any of the structures in the other embodiments as appropriate.

Embodiment 6

In this embodiment, a method for manufacturing a thin film transistor formed in a semiconductor device that is one embodiment of the present invention will be described with reference to FIGS. 6A to 6D, FIGS. 8A to 8C, and FIG. 11. The step illustrated in FIG. 11 corresponds to the step illustrated in FIG. 8B.

As in Embodiment 4, the conductive film 627 is formed through the process of FIGS. 6A to 6D and FIG. 8A.

The conductive film 627 is formed as illustrated in FIG. 8A, and a resist mask is formed over the conductive film 627 by a photolithography step. With the use of the resist mask, the wirings 629a and 629b are formed and the impurity semiconductor film 621 and the semiconductor stacked body 617 are partly etched, whereby the pair of impurity semiconductor films 631a and 631b serving as a source and drain regions is formed. Further, by etching the semiconductor stacked body 617 so that an amorphous semiconductor region 643b is exposed, the semiconductor stacked body 643 having the following structure may be formed: in the regions which are covered with the wirings 629a and 629b, the microcrystalline semiconductor region 643a and the amorphous semiconductor region 643b are stacked, and in the region which is covered with neither the wiring 629a nor the wiring 629b and overlaps with the gate electrode 603, the microcrystalline semiconductor region 643a is not exposed and the amorphous semiconductor region 643b is exposed (see FIG. 11). Note that the etching amount of the semiconductor stacked body 617 here is smaller than that in the case illustrated in FIG. 8B.

The subsequent steps are similar to those in Embodiment 4.

Through the above-described process, a single-gate thin film transistor can be manufactured. Since the back channel is in the amorphous semiconductor region in the thin film transistor in this embodiment, the off-state current can be reduced as compared to the thin film transistor illustrated in FIG. 8B.

Figure 8C:
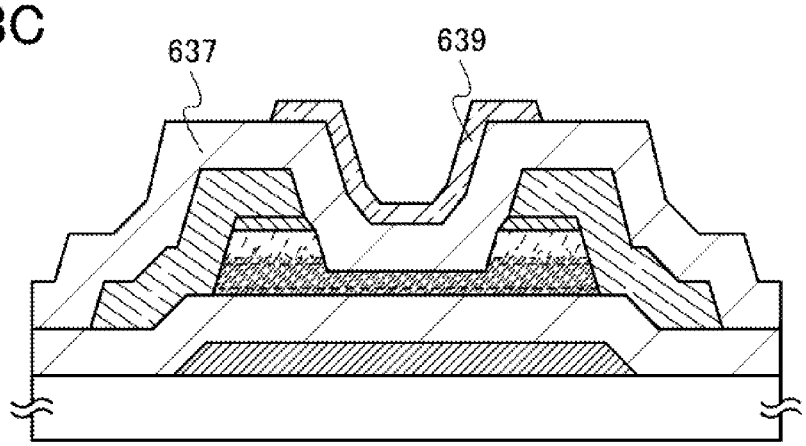
Figure 11:
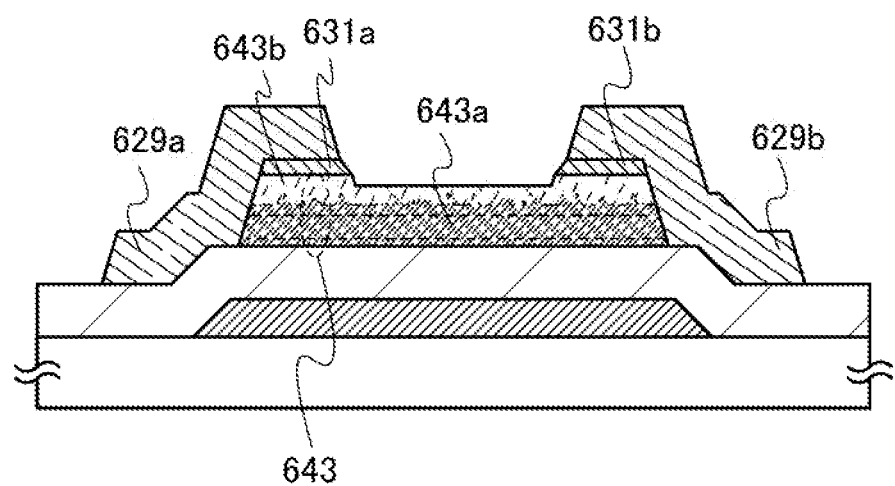
FIG. 11 is a cross-sectional view illustrating an example of a method for manufacturing a semiconductor device according to an embodiment of the present invention.

In this embodiment, after the step illustrated in FIG. 11, the back gate electrode 639 may be formed over the thin film transistor with the insulating film 637 interposed therebetween as in the step illustrated in FIG. 8C.

Note that the structure in this embodiment can be combined with any of the structures in the other embodiments as appropriate.

Embodiment 7

Thin film transistors manufactured by the methods described in Embodiments 4 to 6 can be used in a pixel portion and also in a driver circuit of a semiconductor device having a display function (also referred to as a display device). Further, part or the whole of the driver circuit which includes thin film transistors can be formed over the same substrate as the pixel portion, whereby a system-on-panel can be formed.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes an inorganic EL (electroluminescence) element, an organic EL element, and the like. Furthermore, the display device may include a display medium whose contrast is changed by an electric effect, such as electronic ink.

In addition, the display device includes a panel in which the display element is sealed, and a module in which an IC or the like including a controller is mounted on the panel. Further, an element substrate which is one mode before the display element is completed in a process of manufacturing the display device is provided with a plurality of pixels each having a means for supplying current to the display element. Specifically, the element substrate may be in a state where only a pixel electrode of the display element is formed, a state in which a conductive film to be a pixel electrode is formed but is not etched yet to form the pixel electrode, or any of the other states.

Note that a display device in this specification refers to an image display device, a display device, or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or TCP provided with a printed wiring board at the end thereof; and a module having an integrated circuit (IC) that is directly mounted on a display element by a chip on glass (COG) method.

Embodiment 8

The display device described in Embodiment 7 can be applied to a variety of electronic devices. Examples of electronic devices include a television device (also referred to as a TV or a television receiver). In addition, the display device described in Embodiment 7 can be applied to indoor digital signage, public information displays (PID), advertisements in vehicles such as a train, or the like. In particular, the display device described in Embodiment 7 uses the thin film transistor described in any of Embodiments 4 to 6. Since the thin film transistor has low off-state current, high on-state current and high field-effect mobility, the display device can display high-resolution images or video and reduce power consumption. Accordingly, it is effective to apply the display device to the above-described electronic devices that display images or video for a long period. Examples of electronic devices in which the display device of one embodiment of the present invention is used are illustrated in FIGS. 12A and 12B.

Figure 12A:
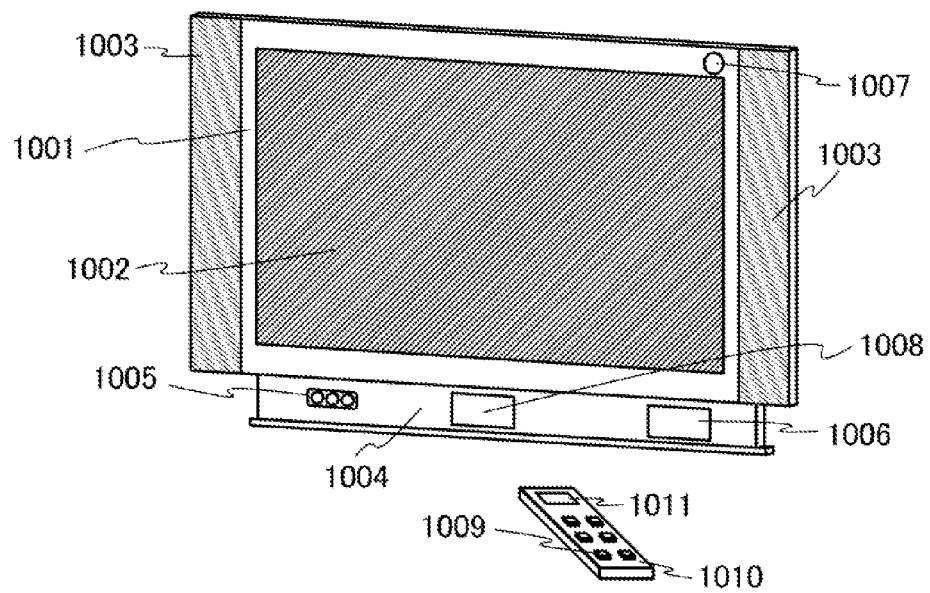
FIGS. 12A and 12B are perspective views illustrating examples of an electronic device including a semiconductor device according to an embodiment of the present invention.
Figure 12B:
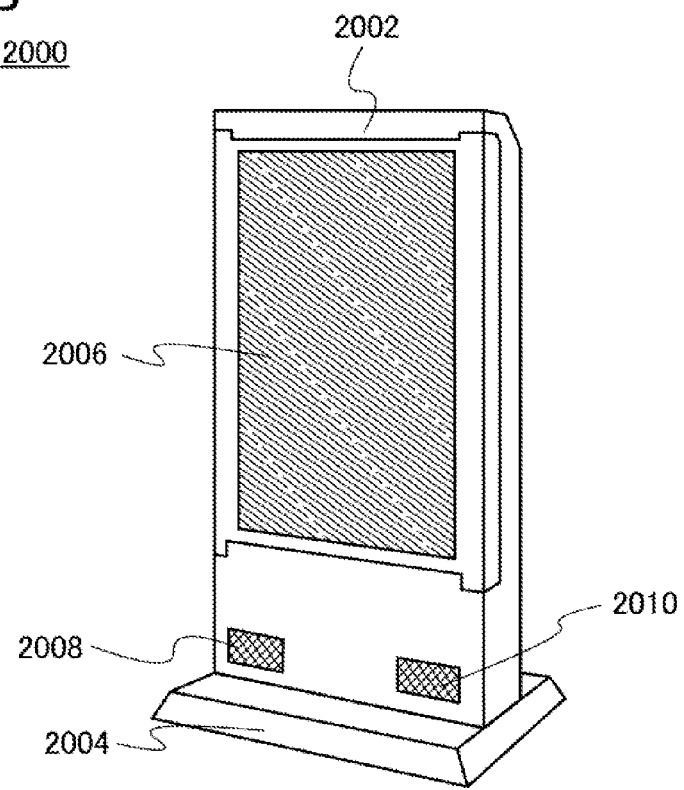

FIG. 12A illustrates an example of a television device. In a television device 1000, a display portion 1002 is incorporated in a housing 1001. Images can be displayed on the display portion 1002. Here, the housing 1001 is supported by a housing 1004. In addition, the television device 1000 is provided with a speaker 1003, operation keys 1005 (including a power switch or an operation switch), a connection terminal 1006, a sensor 1007 (having a function of measuring force, position, distance, light, magnetism, temperature, time, electric field, electric power, humidity, gradient, vibration, or infrared ray), a microphone 1008, and the like.

The television device 1000 can be operated with the operation switch or a separate remote controller 1010. With operation keys 1009 provided in the remote controller 1010, channels or volume can be controlled, whereby an image displayed on the display portion 1002 can be controlled. The remote controller 1010 may include a display portion 1011 for displaying data output from the remote controller 1010.

Note that the television device 1000 is provided with a receiver, a modem, and the like. A general television broadcast can be received with the receiver. Moreover, when the display device is connected to a communication network with or without wires via the modem, one-way (from a sender to a receiver) or two-way (between a sender and a receiver or between receivers) information communication can be performed.

FIG. 12B illustrates an example of digital signage. For example, digital signage 2000 includes two housings, a housing 2002 and a housing 2004. The housing 2002 includes a display portion 2006 and two speakers, a speaker 2008 and a speaker 2010. In addition, the digital signage 2000 may be provided with a sensor so as to operate in a following manner: an image is not displayed when a person is not close to the digital signage.

The display device described in Embodiment 7 can be used in the display portion 1002 of the television device 1000 or the display portion 2006 of the digital signage 2000. Thus, the television device 1000 and the digital signage 2000 can display high-resolution images or video and reduce power consumption.

Note that the structure in this embodiment can be combined with any of the structures in the other embodiments as appropriate.

This application is based on Japanese Patent Application serial no. 2011-027964 filed with Japan Patent Office on Feb. 11, 2011, the entire contents of which are hereby incorporated by reference.

What is claimed is:

1. A method for forming a semiconductor film, the method comprising the steps of:
    setting a substrate between a first electrode that comprises a first upper electrode and a second upper electrode and a second electrode, wherein the first electrode and the second electrode are located in a reaction chamber, and the substrate is set so that the first upper electrode overlaps with the substrate and the second upper electrode does not overlap with the substrate,
    supplying a source gas to the reaction chamber; and
    generating plasma between the first electrode and the second electrode to form the semiconductor film over the substrate,
    wherein the plasma is generated by applying power to the first upper electrode and the second upper electrode in different frequencies so that a plasma density in a region which overlaps with the substrate is lower than a plasma density in a region which does not overlap with the substrate, and
    wherein the frequencies applied to the first upper electrode and the second upper electrode each are equal to or larger than 13.56 MHz and equal to or smaller than 100 MHz.

2. A method for forming a semiconductor film, the method comprising the steps of:
    setting a substrate between a first electrode and a second electrode which are located in a reaction chamber;
    supplying a source gas to the reaction chamber;
    generating plasma of the source gas between the first electrode and the second electrode by supplying power to the first electrode to form the semiconductor film over the substrate;
    supplying hydrogen to the reaction chamber;
    generating plasma of hydrogen between the first electrode and the second electrode to remove part of the semiconductor film from an end portion of the substrate,
    wherein in the step of removing the part of the semiconductor film, a plasma density in a region which overlap with the substrate is arranged to be higher than that in a region which does not overlap with the substrate, and
    wherein the power has a frequency that is equal to or larger than 13.56 MHz and equal to or smaller than 100 MHz.

3. The method according to claim 1,
    wherein the source gas includes hydrogen and a deposition gas, and
    wherein a flow rate ratio of the deposition gas to the hydrogen is varied in the step of forming the semiconductor film while a flow rate of the hydrogen is kept constant.

4. The method according to claim 3,
    wherein the flow rate of the hydrogen is more than or equal to 50 times and less than or equal to 2000 times that of the deposition gas,
    wherein a pressure in the reaction chamber is set to be higher than or equal to 5000 Pa and lower than or equal to 50000 Pa, and
    wherein the power supplied to the first electrode is set to be higher than or equal to 100 W and lower than or equal to 1300 W.

5. The method according to claim 2,
    wherein the source gas includes hydrogen and a deposition gas,
    wherein a flow rate of the hydrogen is more than or equal to 50 times and less than or equal to 2000 times that of the deposition gas,
    wherein a pressure in the reaction chamber is set to be higher than or equal to 5000 Pa and lower than or equal to 50000 Pa, and
    wherein the power supplied to the first electrode is set to be higher than or equal to 100 W and lower than or equal to 1300 W.

6. The method according to claim 1,
wherein a supporting base comprises a metal material and is provided over and in contact with the second electrode,
wherein the supporting base comprises a hollow, and
wherein the substrate is set in the hollow when the semiconductor film is formed.

7. The method according to claim 6,
wherein the plasma density in the region which does not overlap with the substrate has a peak in a region which is over the supporting base and does not overlap with the hollow.

* * * * *